United States Patent
Tatsuzawa et al.

(10) Patent No.: US 11,667,817 B2
(45) Date of Patent: Jun. 6, 2023

(54) ELECTROCONDUCTIVE FILM, ROLL, CONNECTED STRUCTURE, AND PROCESS FOR PRODUCING CONNECTED STRUCTURE

(71) Applicant: HITACHI CHEMICAL COMPANY, LTD., Tokyo (JP)

(72) Inventors: Takashi Tatsuzawa, Tokyo (JP); Kazuya Matsuda, Tokyo (JP); Yutaka Tsuchida, Tokyo (JP); Takashi Seki, Tokyo (JP); Mitsuyoshi Shimamura, Tokyo (JP); Kengo Shinohara, Tokyo (JP); Tetsuyuki Shirakawa, Tokyo (JP); Yasunori Kawabata, Tokyo (JP); Satoru Matsumoto, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 0 days.

(21) Appl. No.: 16/339,145

(22) PCT Filed: Sep. 26, 2017

(86) PCT No.: PCT/JP2017/034743
§ 371 (c)(1),
(2) Date: Apr. 3, 2019

(87) PCT Pub. No.: WO2018/066411
PCT Pub. Date: Apr. 12, 2018

(65) Prior Publication Data
US 2019/0241771 A1    Aug. 8, 2019

(30) Foreign Application Priority Data

Oct. 3, 2016 (JP) .............................. JP2016-195761

(51) Int. Cl.
*H01L 21/68* (2006.01)
*C09J 9/02* (2006.01)
(Continued)

(52) U.S. Cl.
CPC . *C09J 9/02* (2013.01); *C09J 7/00* (2013.01); *C09J 7/30* (2018.01); *C09J 7/401* (2018.01);
(Continued)

(58) Field of Classification Search
CPC ........... H01L 2224/27003; H01L 2224/29499; H05K 3/323
See application file for complete search history.

(56) References Cited

U.S. PATENT DOCUMENTS 5,275,856 A * 1/1994 Calhoun ................... H01R 4/04
428/41.1
9,620,404 B1 * 4/2017 Brun ..................... H01L 25/065
(Continued)

FOREIGN PATENT DOCUMENTS

CN    101681855    3/2010
CN    104541417 A  4/2015
(Continued)

*Primary Examiner* — Fernando L Toledo
*Assistant Examiner* — Valerie N Newton
(74) *Attorney, Agent, or Firm* — Fitch, Even, Tabin & Flannery, LLP

(57) ABSTRACT

A conductive film includes an elongated release film and a plurality of conductive adhesive film pieces provided on the release film. Then, the plurality of adhesive film pieces are arranged in a longitudinal direction X of the release film. For this reason, the adhesive film piece can be set to an arbitrary shape. Accordingly, it is possible to attach the adhesive film piece to adhesive surfaces having various shapes and to efficiently use the adhesive film piece.

31 Claims, 23 Drawing Sheets

(51) Int. Cl.
| | |
|---|---|
| C09J 7/00 | (2018.01) |
| C09J 7/30 | (2018.01) |
| C09J 7/40 | (2018.01) |
| C09J 11/04 | (2006.01) |
| C09J 201/00 | (2006.01) |
| H01B 1/22 | (2006.01) |
| H01B 5/14 | (2006.01) |
| H01B 5/16 | (2006.01) |
| H01L 23/00 | (2006.01) |
| H01R 11/01 | (2006.01) |

(52) U.S. Cl.
CPC ............ *C09J 11/04* (2013.01); *C09J 201/00* (2013.01); *H01B 1/22* (2013.01); *H01B 5/14* (2013.01); *H01B 5/16* (2013.01); *H01L 24/27* (2013.01); *H01L 24/29* (2013.01); *H01L 24/83* (2013.01); *H01R 11/01* (2013.01); *C09J 2203/326* (2013.01); *C09J 2423/045* (2013.01); *C09J 2423/105* (2013.01); *C09J 2425/00* (2013.01); *C09J 2463/00* (2013.01); *C09J 2467/005* (2013.01); *H01L 24/32* (2013.01); *H01L 2224/2711* (2013.01); *H01L 2224/27334* (2013.01); *H01L 2224/29012* (2013.01); *H01L 2224/29013* (2013.01); *H01L 2224/29014* (2013.01); *H01L 2224/29239* (2013.01); *H01L 2224/29244* (2013.01); *H01L 2224/29247* (2013.01); *H01L 2224/29255* (2013.01); *H01L 2224/29264* (2013.01); *H01L 2224/29293* (2013.01); *H01L 2224/32225* (2013.01); *H01L 2224/32227* (2013.01); *H01L 2224/743* (2013.01); *H01L 2224/83121* (2013.01); *H01L 2224/83191* (2013.01); *H01L 2224/83851* (2013.01); *H01L 2224/97* (2013.01)

(56) References Cited

U.S. PATENT DOCUMENTS

| | | |
|---|---|---|
| 2005/0255275 A1 | 11/2005 | Downs et al. |
| 2015/0319867 A1* | 11/2015 | Sato .................. C09D 123/0853 361/760 |

FOREIGN PATENT DOCUMENTS

| | | |
|---|---|---|
| JP | H3-285977 A | 12/1991 |
| JP | H11-092716 A | 4/1999 |
| JP | H11-121072 A | 4/1999 |
| JP | 2004-277573 A | 10/2004 |
| JP | 2007-246551 A | 9/2007 |
| JP | 2008-274019 A | 11/2008 |
| JP | 2009-004767 A | 1/2009 |
| JP | 2010-523841 A | 7/2010 |
| JP | 2015-135748 A | 7/2015 |
| KR | 10-2009-0085017 A | 8/2009 |
| TW | 226406 B | 7/1994 |

* cited by examiner

Fig.8
(a)
(b)
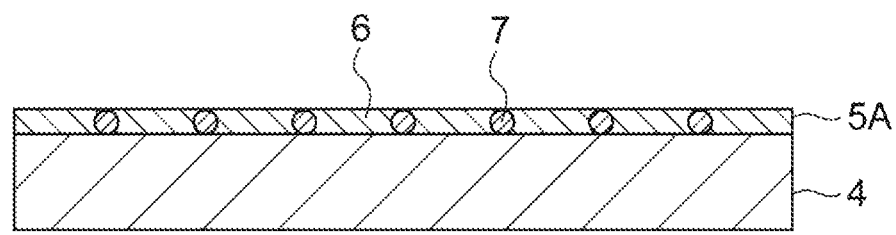
(c)
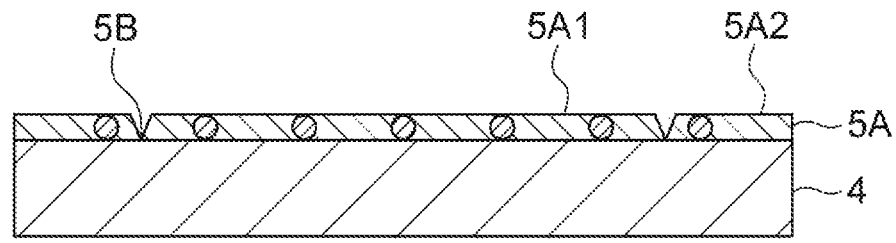
(d)
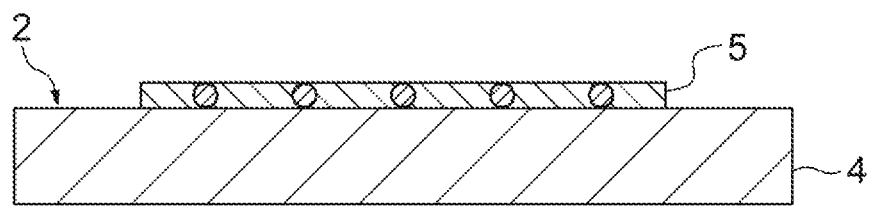

Fig.20
(a)
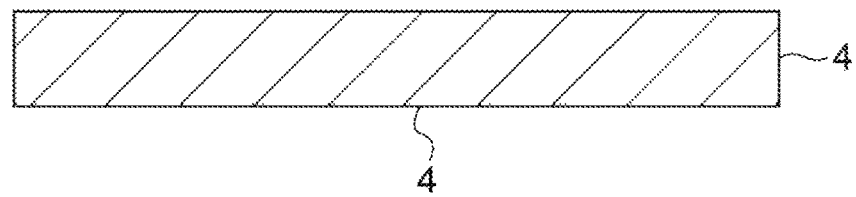
(b)
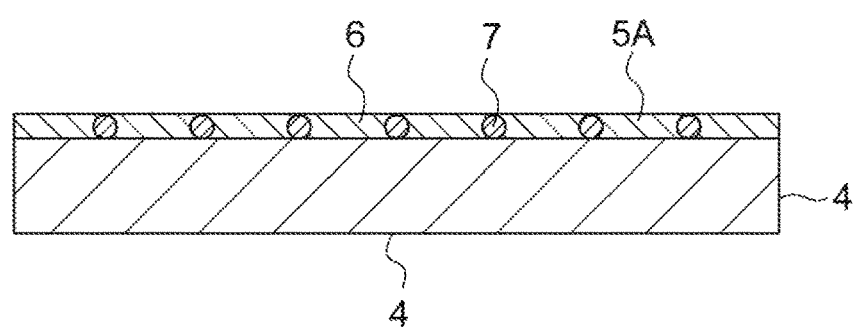
(c)
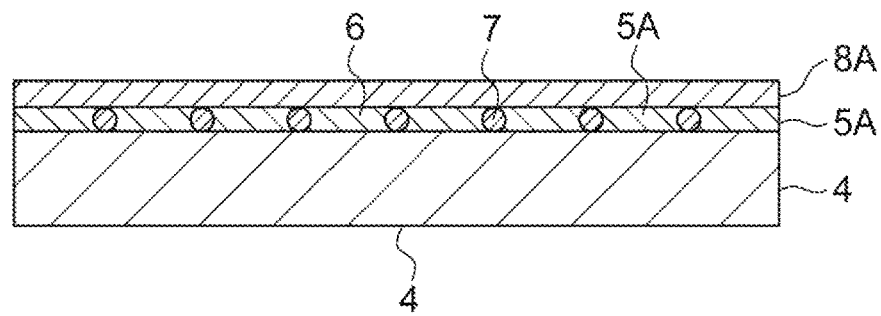
(d)
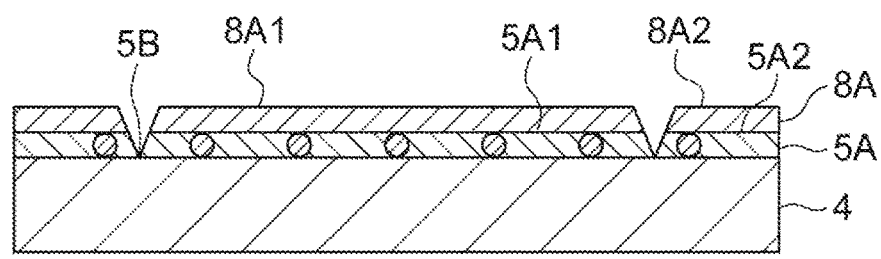
(e)
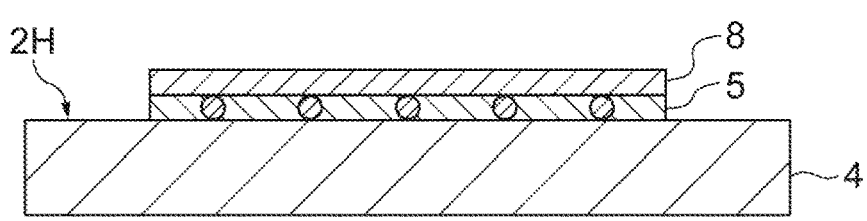

ELECTROCONDUCTIVE FILM, ROLL, CONNECTED STRUCTURE, AND PROCESS FOR PRODUCING CONNECTED STRUCTURE

CROSS-REFERENCE TO RELATED APPLICATIONS

This application is a U.S. national phase application filed under 35 U.S.C. § 371 of International Application No. PCT/JP2017/034743, filed Sep. 26, 2017, designating the United States, which claims priority from Japanese Patent Application No. 2016-195761, filed Oct. 3, 2016, which are hereby incorporated herein by reference in their entirety.

TECHNICAL FIELD

The invention relates to a conductive film, a wound body, a connection structure, and a connection structure manufacturing method.

BACKGROUND ART

In some cases, a conductive film such as an anisotropic conductive film is used at the time of manufacturing a connection structure by connecting a first circuit member such as an IC chip and a second circuit member such as a glass substrate (for example, see Patent Literatures 1 and 2). The conductive film is one in which an adhesive film is formed on an entire surface of an elongated release film. The anisotropic conductive film is formed such that an adhesive film in which conductive particles are dispersed in an adhesive is formed on the entire surface of the elongated release film. The conductive film is provided as a wound body in which the conductive film is wound on a core and is unwound from the wound body at the time of connecting the first circuit member and the second circuit member. Then, the adhesive film of the conductive film is attached to an adhesive surface of the first circuit member and then the adhesive surface of the first circuit member and the adhesive surface of the second circuit member are overlapped with the adhesive film interposed therebetween.

CITATION LIST

Patent Literature

Patent Literature 1: Japanese Unexamined Patent Publication No. 2008-274019
Patent Literature 2: Japanese Unexamined Patent Publication No. 2015-135748

SUMMARY OF INVENTION

Technical Problem

Incidentally, the shape of the adhesive surface to which the adhesive film is attached becomes different depending on the type of connection structure. For this reason, when the adhesive film is formed on the entire surface of the release film, the adhesive film can only be attached to a rectangular adhesive surface that has the same width as the release film. When the shape of the adhesive surface is not the rectangular shape having the same width as the release film, the adhesive surface can only be attached to a part of the adhesive film in the adhesive film provided on the release film. For this reason, the remaining adhesive film becomes useless.

Here, an aspect of the invention is to provide a conductive film capable of attaching an adhesive film to adhesive surfaces having various shapes and efficiently using the adhesive film, a wound body, a connection structure, and a connection structure manufacturing method.

Solution to Problem

A conductive film according to an aspect of the invention includes: an elongated release film; and a plurality of conductive adhesive film pieces which are provided on the release film, in which the plurality of adhesive film pieces are arranged in a longitudinal direction of the release film.

In the conductive film, the plurality of adhesive film pieces are arranged on the elongated release film in the longitudinal direction of the release film. For this reason, the adhesive film piece can be set to an arbitrary shape. Accordingly, it is possible to attach the adhesive film piece to the adhesive surfaces having various shapes and to efficiently use the adhesive film piece.

In the conductive film, the plurality of adhesive film pieces may be spaced in the longitudinal direction of the release film. In the conductive film, since the plurality of adhesive film pieces are spaced in the longitudinal direction of the release film, it is possible to attach the adhesive film piece to the adhesive surface without affecting the near adhesive film piece. Accordingly, it is possible to easily attach the adhesive film piece to the adhesive surface. Further, it is possible to further improve a degree of freedom in the shape of the adhesive film piece.

In the conductive film, the plurality of adhesive film pieces may have the same shape. In the conductive film, since the plurality of adhesive film pieces have the same shape, it is possible to efficiently attach the adhesive film piece to the plurality of adhesive surfaces having the same shape.

In the conductive film, the plurality of adhesive film pieces may be disposed at a center portion of the release film in a width direction. In the conductive film, the plurality of adhesive film pieces are disposed at the center portion of the release film in the width direction, it is possible to easily position the conductive film with respect to the adhesive surface at the time of attaching the adhesive film piece to the adhesive surface.

In the conductive film, the plurality of adhesive film pieces may be disposed at an end portion of the release film in a width direction. In the conductive film, since the plurality of adhesive film pieces are disposed at the end portion of the release film in the width direction, it is possible to easily attach the adhesive film piece to the adhesive surface even when there is no enough space at one side of the adhesive surface.

In the conductive film, the plurality of adhesive film pieces may be also arranged in the width direction of the release film. In the conductive film, since the plurality of adhesive film pieces are also arranged in the width direction of the release film, it is possible to increase the density of the adhesive film piece with respect to the release film. Accordingly, it is possible to provide more adhesive film pieces on the release film.

In the conductive film, a gap of the plurality of adhesive film pieces in the longitudinal direction of the release film may be 0.1 mm or more and 10 mm or less. In the conductive film, since a gap of the plurality of adhesive film pieces in the longitudinal direction of the release film is 0.1 mm or more, it is possible to easily attach the adhesive film piece to the adhesive surface without affecting the near adhesive film piece. Meanwhile, since the gap is 10 mm or less, it is possible to increase the density of the adhesive film piece with respect to the release film and to provide more adhesive film pieces on the release film.

In the conductive film, a gap between an end edge of the release film and the adhesive film piece closest to the end edge in the width direction of the release film may be 0.1 mm or more and 10 mm or less. In the conductive film, since a gap between an end edge of the release film and the adhesive film piece closest to the end edge in the width direction of the release film is 0.1 mm or more, it is possible to prevent the adhesive film piece from being released from the release film even when the end portion of the release film interferes with the other members. Meanwhile, since the gap is 10 mm or less, it is possible to efficiently provide the adhesive film piece on the release film.

Incidentally, there is a need to specify the position of the adhesive film piece in the conductive film at the time of attaching the adhesive film piece to the adhesive surface with high accuracy. Here, a method of detecting the position of the adhesive film piece in the conductive film by the imaging device is considered. However, it is preferable to dispose the imaging device at the opposite side of the adhesive film piece with respect to the release film when considering the attachment of the adhesive film piece with respect to the adhesive surface later. Here, in the conductive film, the release film may have light transmittance. In the conductive film, since the release film has light transmittance, it is possible to detect the position of the adhesive film piece in the conductive film by the imaging device even when the imaging device is disposed at the opposite side of the adhesive film piece with respect to the release film.

In the conductive film, transmittance of the release film may be 15% or more and 100% or less. In the conductive film, since the transmittance of the release film is 15% or more, it is possible to easily detect the position of the adhesive film piece from the release film. Meanwhile, since the transmittance of the release film is 100% or less, it is possible to easily manufacture the release film.

In the conductive film, a haze value of the release film may be 3% or more and 100% or less. In the conductive film, since the haze value of the release film is 3% or more, it is possible to easily detect the position of the adhesive film piece from the release film. Meanwhile, since the haze value of the release film is 100% or less, it is possible to easily manufacture the release film.

The conductive film may further include a second release film piece which is provided on the adhesive film piece. In the conductive film, since the surface of the adhesive film piece is covered with the second release film piece, it is possible to protect the adhesive film piece. For this reason, for example, when the conductive film is wound as the wound body, it is possible to prevent the adhesive film piece from being transferred to the release film adjacent to the inner peripheral side or the outer peripheral side.

In the conductive film, the adhesive film piece may be formed such that conductive particles are dispersed in an adhesive. In the conductive film, since the adhesive film piece is formed such that conductive particles are dispersed in the adhesive, the conductive film can have anisotropic conductivity.

A wound body according to an aspect of the invention includes: any one of the above-described conductive films and a core on which the conductive film is wound.

In the wound body, since any one of the above-described conductive films is wound on the core, it is possible to attach the adhesive film piece to the adhesive surfaces having various shapes and to efficiently use the adhesive film piece.

A connection structure according to an aspect of the invention includes: a first circuit member that includes a first adhesive surface; a second circuit member that includes a second adhesive surface; and any one of the above-described adhesive film pieces which connect the first adhesive surface and the second adhesive surface.

In the connection structure, the first adhesive surface and the second adhesive surface are connected by any one of the above-described adhesive film pieces. For this reason, it is possible to obtain the connection structure in which the adhesive film piece is appropriately attached to the first adhesive surface and the second adhesive surface regardless of the shapes of the first adhesive surface and the second adhesive surface.

A connection structure manufacturing method according to an aspect of the invention includes: a film manufacturing step of manufacturing a conductive film in which a plurality of conductive adhesive film pieces are provided on an elongated release film and the plurality of adhesive film pieces are arranged in a longitudinal direction of the release film; and a connection step of connecting a first adhesive surface of a first circuit member and a second adhesive surface of a second circuit member with the adhesive film piece of the conductive film interposed therebetween.

In the connection structure manufacturing method, the conductive film in which the plurality of adhesive film pieces are provided on the release film is manufactured and the first adhesive surface and the second adhesive surface are connected with the adhesive film piece of the conductive film interposed therebetween. Then, since the adhesive film piece can be set to an arbitrary shape, it is possible to manufacture the connection structure in which the adhesive film piece is appropriately attached to the first adhesive surface and the second adhesive surface regardless of the shapes of the first adhesive surface and the second adhesive surface. Further, it is possible to efficiently use the adhesive film piece.

In the connection structure manufacturing method, the adhesive film piece may be formed such that conductive particles are dispersed in an adhesive. In the connection structure manufacturing method, the adhesive film piece is formed such that conductive particles are dispersed in the adhesive, the adhesive film piece can have anisotropic conductivity.

In the connection structure manufacturing method, the film manufacturing step may include an adhesive film layer forming step of forming a conductive adhesive film layer on an entire surface of the release film, an adhesive film layer cutting step of cutting the adhesive film layer along an outline forming an outer shape of the adhesive film piece, and a margin releasing step of releasing a margin portion corresponding to a portion other than the adhesive film piece in the adhesive film layer from the release film along the cut outline. In the connection structure manufacturing method, the adhesive film layer is formed on the entire surface of the release film, the adhesive film layer is cut along the outline, and the margin portion is released from the release film along the cut outline. Accordingly, it is possible to easily provide the plurality of adhesive film pieces on the release film.

In the connection structure manufacturing method, the adhesive film layer may be formed such that conductive particles are dispersed in the adhesive. In the connection structure manufacturing method, since the adhesive film layer is formed such that conductive particles are dispersed in the adhesive, the adhesive film piece obtained by cutting the adhesive film layer can have anisotropic conductivity.

In the connection structure manufacturing method, the connection step may include a position detecting step of detecting a position of the adhesive film piece in the conductive film by an imaging device, an attachment step of attaching the adhesive film piece to the first adhesive surface on the basis of the position detected by the position detecting step, and an overlapping step of overlapping the first adhesive surface and the second adhesive surface with the adhesive film piece interposed therebetween. In the connection structure manufacturing method, the position of the adhesive film piece in the conductive film is detected by the imaging device and the adhesive film piece is attached to the first adhesive surface on the basis of the detected position. For this reason, it is possible to improve the position accuracy of the adhesive film piece with respect to the adhesive surface. Then, since the first adhesive surface and the second adhesive surface are overlapped with the adhesive film piece interposed therebetween, it is possible to easily accommodate the adhesive film piece in the first adhesive surface and the second adhesive surface.

In the connection structure manufacturing method, the conductive film may be manufactured such that a second release film piece is provided on the adhesive film piece in the film manufacturing step. In the connection structure manufacturing method, since the surface of the adhesive film piece is covered with the second release film piece, it is possible to protect the adhesive film piece. For this reason, for example, when the conductive film is wound as the wound body, it is possible to prevent the adhesive film piece from being transferred to the release film adjacent to the inner peripheral side or the outer peripheral side.

In the connection structure manufacturing method, the film manufacturing step may include an adhesive film layer forming step of forming a conductive adhesive film layer on an entire surface of the release film and covering an entire surface of the adhesive film layer with a second release film, an adhesive film layer cutting step of cutting the adhesive film layer and the second release film along an outline forming an outer shape of the adhesive film piece, and a margin releasing step of releasing a margin portion corresponding to a portion other than the adhesive film piece in the adhesive film layer and the second release film from the release film along the cut outline. In the connection structure manufacturing method, the adhesive film layer is formed on the entire surface of the release film, the entire surface of the adhesive film layer is covered with the second release film, the adhesive film layer is cut along the outline, and the margin portion is released from the release film along the cut outline. Accordingly, it is possible to easily provide the plurality of adhesive film pieces on the release film and to cover the adhesive film piece with the second release film piece.

In the connection structure manufacturing method, the adhesive film layer may be formed such that conductive particles are dispersed in the adhesive. In the connection structure manufacturing method, since the adhesive film layer is formed such that conductive particles are dispersed in the adhesive, the adhesive film piece which is obtained by cutting the adhesive film layer can have anisotropic conductivity.

In the connection structure manufacturing method, the connection step may include a position detecting step of detecting a position of the adhesive film piece in the conductive film by an imaging device, an attachment step of attaching the adhesive film piece to the first adhesive surface on the basis of the position detected by the position detecting step, an overlapping step of overlapping the first adhesive surface and the second adhesive surface with the adhesive film piece interposed therebetween, and a second release film piece releasing step of releasing the second release film piece from the adhesive film piece before the attachment step. In the connection structure manufacturing method, the position of the adhesive film piece in the conductive film is detected by the imaging device and the adhesive film piece is attached to the first adhesive surface on the basis of the detected position. For this reason, it is possible to improve the position accuracy of the adhesive film piece with respect to the adhesive surface. Then, since the first adhesive surface and the second adhesive surface are overlapped with the adhesive film piece interposed therebetween, it is possible to easily accommodate the adhesive film piece in the first adhesive surface and the second adhesive surface. Then, since the second release film piece is released from the adhesive film piece before the attachment step, it is possible to reliably attach the adhesive film piece to the first adhesive surface.

In the connection structure manufacturing method, the adhesive film piece may be attached to the first adhesive surface and then the release film may be released from the adhesive film piece in the attachment step. In the connection structure manufacturing method, since the adhesive film piece is attached to the first adhesive surface and then the release film is released from the adhesive film piece, it is possible to easily attach the adhesive film piece to the first adhesive surface.

In the connection structure manufacturing method, the connection step may further include a film cutting step of cutting the conductive film into a plurality of conductive film pieces in which one or the plurality of adhesive film pieces are provided in the release film before the position detecting step and in the position detecting step, the position of the adhesive film piece of the conductive film piece may be detected by the imaging device. In the connection structure manufacturing method, since the conductive film is cut into the plurality of conductive film pieces, it is possible to flexibly handle a case in which the adhesive film piece is attached to a plurality of positions or the attachment direction of the adhesive film piece needs to be changed. Then, since the position of the adhesive film piece of the conductive film piece is detected by the imaging device, it is possible to improve the position accuracy of the adhesive film piece with respect to the adhesive surface even when the conductive film is cut into a plurality of conductive film pieces.

Advantageous Effects of Invention

According to the invention, it is possible to attach the adhesive film to adhesive surfaces having various shapes and to efficiently use the adhesive film.

Possible.

BRIEF DESCRIPTION OF DRAWINGS

FIGS. 8(a), 8(b), 8(c), and 8(d) are cross-sectional views illustrating the film manufacturing step illustrated in FIG. 6.

FIGS. 20(a), 20(b), 20(c), 20(d), and 20(e) are cross-sectional views illustrating a film manufacturing step in an anisotropic conductive film manufacturing method of the first modified example.

DESCRIPTION OF EMBODIMENTS

Figure 1:
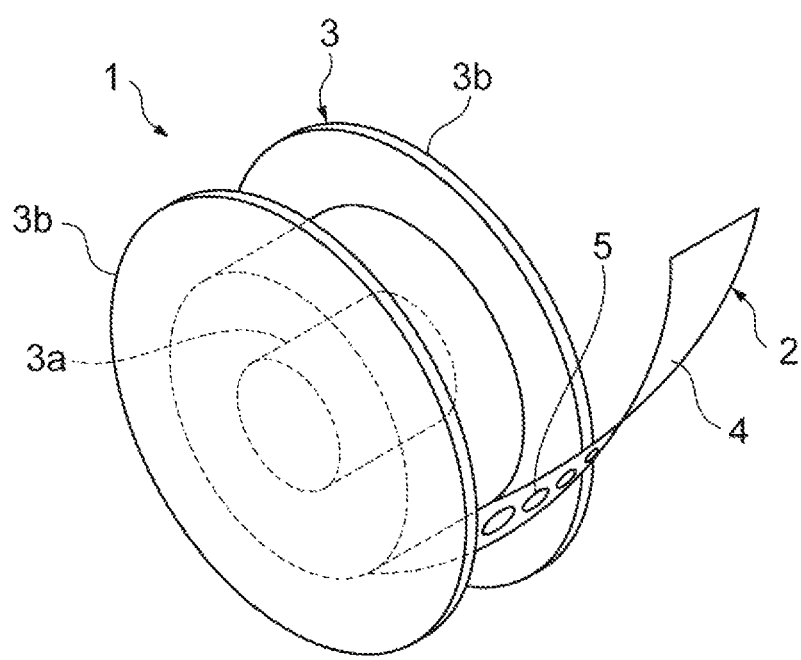
FIG. 1 is a perspective view illustrating a wound body according to an embodiment.

Hereinafter, preferred embodiments of the invention will be described in detail with reference to the drawings. In the embodiment, a conductive film according to the invention is applied to an anisotropic conductive film having anisotropic conductivity. However, the conductive film according to the invention can be also applied to various conductive films not having anisotropic conductivity. Additionally, in the drawings, the same or equivalent components are indicated by the same reference numerals and a redundant description thereof is omitted. Further, a dimensional ratio and the like are appropriately changed in order to easily understand the drawings.

[Wound Body]

As illustrated in FIG. 1, a wound body 1 includes an elongated (tape-like) anisotropic conductive film 2 and a core 3 on which the anisotropic conductive film 2 is wound. That is, the wound body 1 is obtained such that the anisotropic conductive film 2 is wound on the core 3.

The core 3 includes a core material 3a and a pair of side plates 3b. The core material 3a is formed in a columnar shape. The anisotropic conductive film 2 is wound on the outer peripheral surface of the core material 3a. The pair of side plates 3b is attached to both end portions of the core material 3a in the axial direction. The pair of side plates 3b supports the anisotropic conductive film 2 from the right and left sides. A gap of the pair of side plates 3b is slightly wider than the width of the anisotropic conductive film 2.

[Anisotropic Conductive Film]

Figure 2:
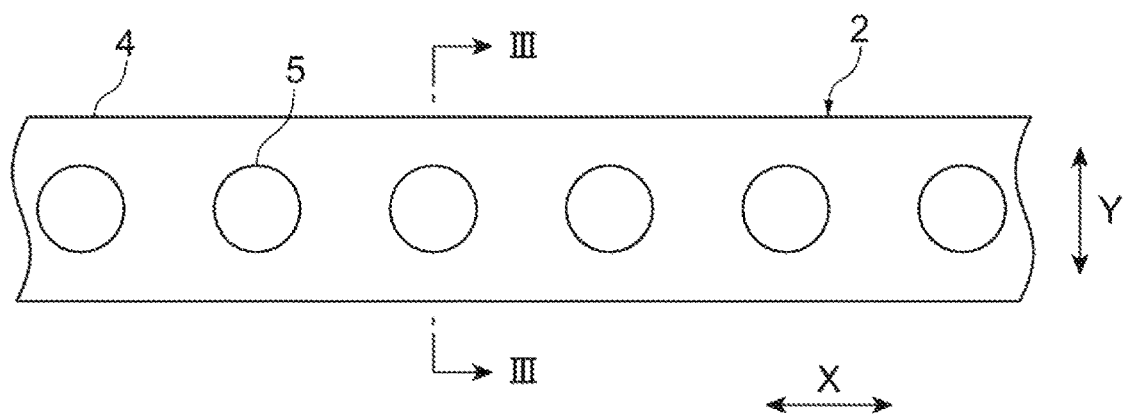
FIG. 2 is a plan view illustrating an anisotropic conductive film according to the embodiment.
Figure 3:
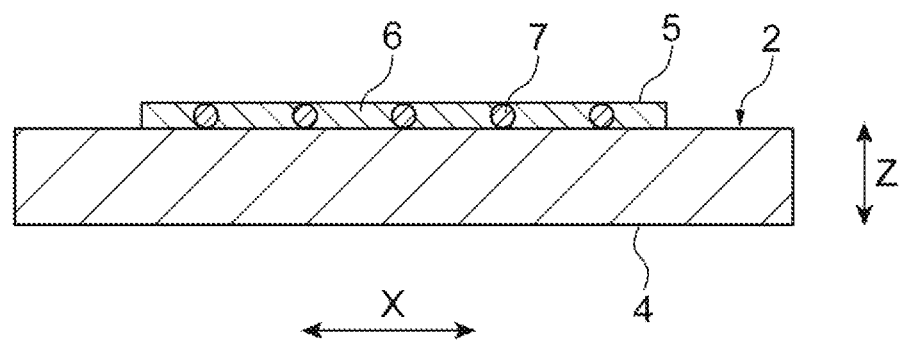
FIG. 3 is a cross-sectional view taken along a line III-III of FIG. 2.

As illustrated in FIGS. 1 to 3, the anisotropic conductive film 2 includes an elongated (tape-like) release film 4 and a plurality of conductive adhesive film pieces 5 which are provided on the release film 4. In the adhesive film piece 5, conductive particles 7 are dispersed in the adhesive 6 in order to have conductivity. Additionally, the outer shape of the anisotropic conductive film 2 is defined by the outer shape of the release film 4 in plan view.

The release film 4 is attached to the adhesive film piece 5 and supports the adhesive film piece 5. As the material of the release film 4, for example, polyethylene terephthalate (PET), polyethylene, polypropylene, or the like can be used. The release film 4 may contain any filler. Further, the surface of the release film 4 may be subjected to a release treatment, a plasma treatment, and the like.

Incidentally, there is a need to specify the position of the adhesive film piece 5 of the anisotropic conductive film 2 at the time of attaching the adhesive film piece 5 to an adhesive surface (not illustrated) of an adhering target (not illustrated) with high accuracy. Here, a method of detecting the position of the adhesive film piece 5 of the anisotropic conductive film 2 by an imaging device 21 (see FIG. 11) is considered. However, it is preferable to dispose the imaging device 21 at the opposite side of the adhesive film piece 5 with respect to the release film 4 when considering the attachment of the adhesive film piece 5 with respect to the adhesive surface later.

Here, the release film 4 may have light transmittance in order to detect the position of the adhesive film piece 5 from the release film 4 by the imaging device 21.

In this case, the transmittance of the release film 4 can be set to 15% or more and 100% or less, is preferably 15% or more and 99% or less, and is more preferably 16% or more and 98% or less.

The transmittance of the release film 4 can be measured as below. A release film cut into a square size of 50 mm×50 mm is set in a haze meter (for example, NDH-5000 manufactured by Nippon Denshoku Kogyo Co., Ltd.) and the total light transmittance is measured. Then, this measurement result is set to the transmittance of the release film 4.

Further, the haze value of the release film 4 can be set to 3% or more and 100% or less, is preferably 3% or more and 99% or less, and is more preferably 4% or more and 99% or less.

The haze value of the release film 4 can be measured as below. A release film cut into a square size of 50 mm×50 mm is set in a haze meter (for example, NDH-5000 manufactured by Nippon Denshoku Kogyo Co., Ltd.) and the haze value is measured. Then, this measurement result is set as the haze value of the release film 4.

As the adhesive 6 constituting the adhesive film piece 5, for example, thermoplastic resin, thermosetting resin, a mixed material of thermoplastic resin and thermosetting resin, and photocurable resin are used. As the thermoplastic resin, for example, styrene resin and polyester resin are used. As the thermosetting resin, for example, epoxy resin and silicone resin are used. When the thermoplastic resin and the thermosetting resin, a heating/pressing operation is generally required. There is a need to flow the resin to obtain adhesion with an adhering object in the thermoplastic resin and to carry out a curing reaction of the resin in the thermosetting resin. Further, since the photocurable resin does not require a heating operation for curing, the photocurable resin is useful when a low-temperature connection is required.

As the conductive particles 7 constituting the adhesive film piece 5, for example, metallic particles such as Au, Ag, Ni, Cu, Pd, and solder and carbon particles are used. Further, the conductive particles 7 may be obtained by covering the surface of transition metal such as Ni or Cu with noble metal such as Au or Pd. Further, the conductive particles 7 may have a conductive layer formed on the surface of the non-conductive particle by a method of covering the surfaces of the nonconductive particles such as glass, ceramic, or plastic with a conductive material. The conductive particles 7 may be those in which the outermost layer is formed of noble metal or those which use heat melting metal particles.

The plurality of adhesive film pieces 5 are arranged in the longitudinal direction X of the release film 4. The longitudinal direction X of the release film 4 indicates a direction in which the anisotropic conductive film 2 is unwound from the wound body 1.

Figure 12:
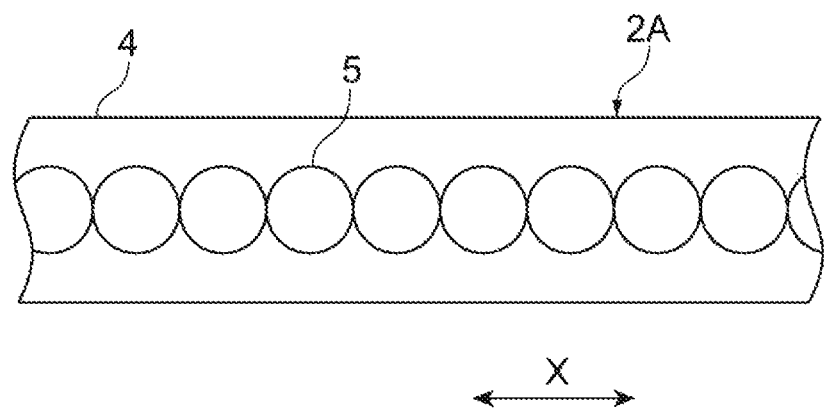
FIG. 12 is a plan view illustrating an anisotropic conductive film of a modified example.

Here, the plurality of adhesive film pieces 5 may be spaced in the longitudinal direction X of the release film 4 or may be connected in the longitudinal direction X of the release film 4. As illustrated in FIG. 2, in the embodiment, the plurality of adhesive film pieces 5 are spaced in the longitudinal direction X of the release film 4. However, the plurality of adhesive film pieces 5 may be connected in the longitudinal direction X of the release film 4 similarly to an anisotropic conductive film 2A illustrated in FIG. 12.

Figure 13:
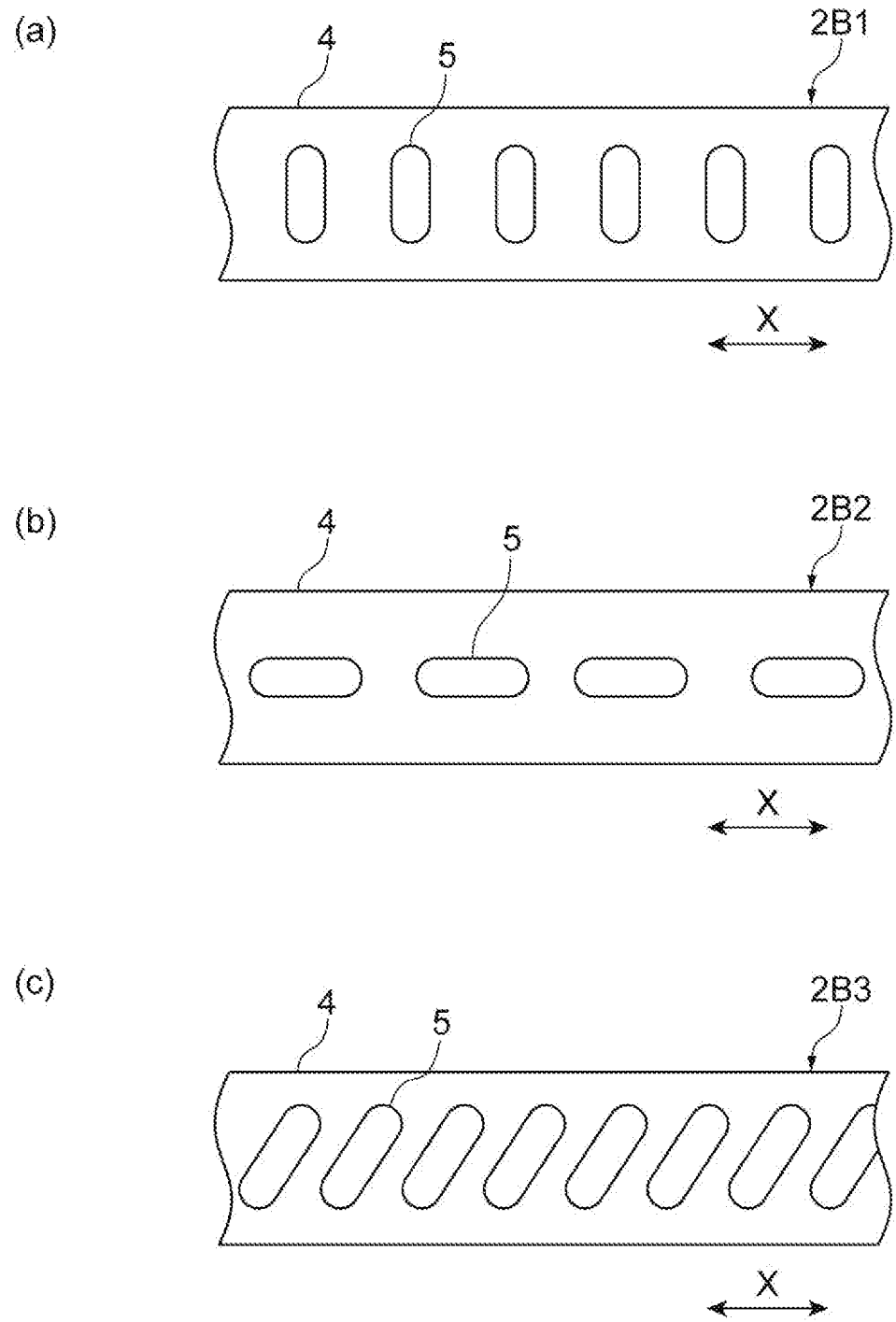
FIGS. 13(a), 13(b), and 13(c) are plan views illustrating anisotropic conductive films of modified examples.
Figure 14:
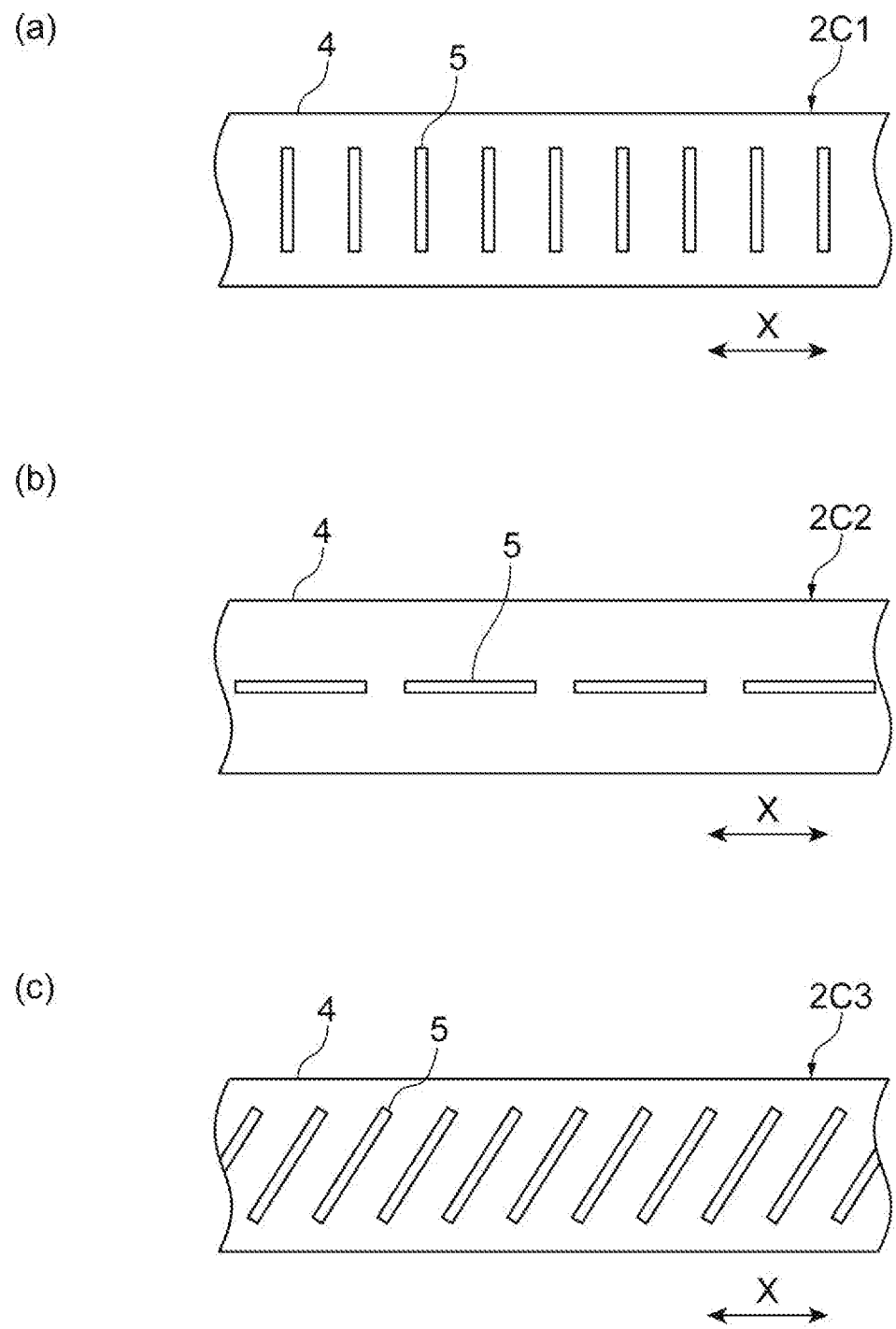
FIGS. 14(a), 14(b), and 14(c) are plan views illustrating anisotropic conductive films of modified examples.

Further, the shape of the adhesive film piece 5 is not particularly limited and can be set to various shapes. As illustrated in FIG. 2, in the embodiment, the adhesive film piece 5 is formed in a circular shape. However, the adhesive film piece 5 may be formed in an oval shape as in an anisotropic conductive film 2B1 illustrated in FIG. 13(*a*) or an elongated linear shape as in an anisotropic conductive film 2C1 illustrated in FIG. 14(*a*). In such a case, the adhesive film piece 5 may extend in a direction orthogonal to the longitudinal direction X of the release film 4 as in the anisotropic conductive film 2B1 illustrated in FIG. 13(*a*) and the anisotropic conductive film 2C1 illustrated in FIG. 14(*a*), may extend in a direction parallel to the longitudinal direction X of the release film 4 as in an anisotropic conductive film 2B2 illustrated in FIG. 13(*b*) and an anisotropic conductive film 2C2 illustrated in FIG. 14(*b*), and may extend in a direction inclined with respect to the longitudinal direction X of the release film 4 as in an anisotropic conductive film 2B3 illustrated in FIG. 13(*c*) and an anisotropic conductive film 2C3 illustrated in FIG. 14(*c*).

Figure 18:
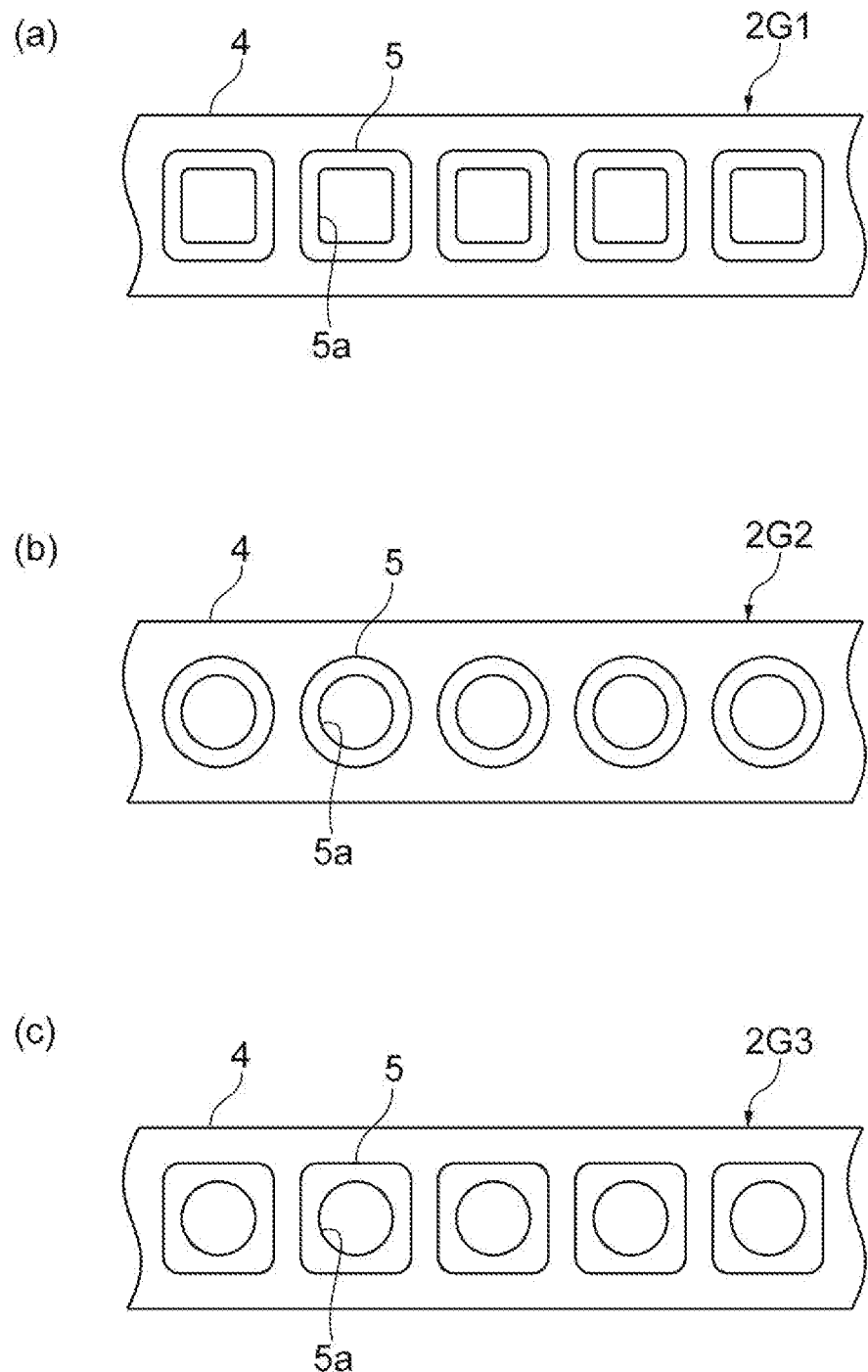
FIGS. 18(a), 18(b), and 18(c) are plan views illustrating anisotropic conductive films of modified examples.

Further, the adhesive film piece 5 may be provided with a hole. As illustrated in FIG. 2, in the embodiment, the adhesive film piece 5 is not provided with a hole. However, a hole 5*a* may be formed in the adhesive film piece 5 as in an anisotropic conductive film 2G1 illustrated in FIG. 18(*a*), an anisotropic conductive film 2G2 illustrated in FIG. 18(*b*), and an anisotropic conductive film 2G3 illustrated in FIG. 18(*c*). The hole 5*a* is formed by punching out (perforating) a part of the adhesive film piece 5. The shape, size, position, number, and the like of the hole 5*a* are not particularly limited. For example, the hole 5*a* may be similar to the adhesive film piece 5 or may not be similar to the adhesive film piece 5. As the shape of the hole 5*a*, a circle such as a perfect circle and an ellipse, a polygon such as a triangle and a quadrilateral, a star shape, and a complicated shape such as various marks can be exemplified. Examples of the square include a square, a rectangle, and a trapezoid. The position of the hole 5*a* may be the center portion of the adhesive film piece 5 or the end portion of the adhesive film piece 5. The number of the holes 5*a* formed in one adhesive film piece 5 may be one or two or more. When a plurality of the holes 5*a* are formed in one adhesive film piece 5, the shapes, sizes, and the like of the holes 5*a* may be the same or different. In the anisotropic conductive film 2G1 illustrated in FIG. 18(*a*), a square hole 5*a* similar to the adhesive film piece 5 is formed at the center portion of the adhesive film piece 5 having a square outer shape. In the anisotropic conductive film 2G2 illustrated in FIG. 18(*b*), a circular hole 5*a* similar to the adhesive film piece 5 is formed at the center portion of the adhesive film piece 5 having a circular outer shape. In the anisotropic conductive film 2G3 illustrated in FIG. 18(*c*), a circular square hole 5*a* is formed at the center portion of the adhesive film piece 5 having a square outer shape.

Figure 15:
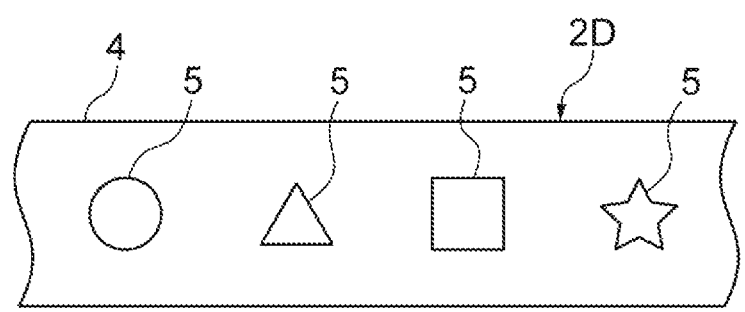
FIG. 15 is a plan view illustrating anisotropic conductive films of modified examples.

Further, the plurality of adhesive film pieces 5 may have the same shape or different shapes. As illustrated in FIG. 2, in the embodiment, all of the plurality of adhesive film pieces 5 have the same shape. However, the plurality of adhesive film pieces 5 may have different shapes as in an anisotropic conductive film 2D illustrated in FIG. 15. In this case, all adhesive film pieces 5 may have different shapes or the adhesive film pieces 5 having different shapes and the adhesive film pieces 5 having the same shape may exist together.

Figure 16:
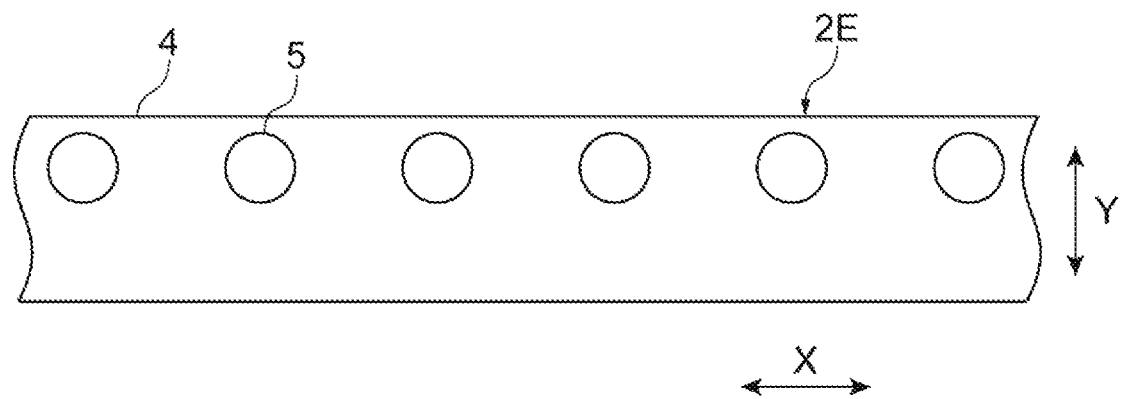
FIG. 16 is a plan view illustrating an anisotropic conductive film of a modified example.

Further, the plurality of adhesive film pieces 5 may be disposed at any position in the width direction Y of the release film 4. The width direction Y of the release film 4 indicates a direction orthogonal to the longitudinal direction X of the release film 4 and the thickness direction Z of the release film 4 (see FIG. 3). For example, as illustrated in FIG. 2, in the embodiment, the adhesive film piece 5 is disposed on the center portion in the width direction Y of the release film 4. However, the adhesive film piece 5 may be disposed at the end portion in the width direction Y of the release film 4 as in an anisotropic conductive film 2E illustrated in FIG. 16.

Figure 17:
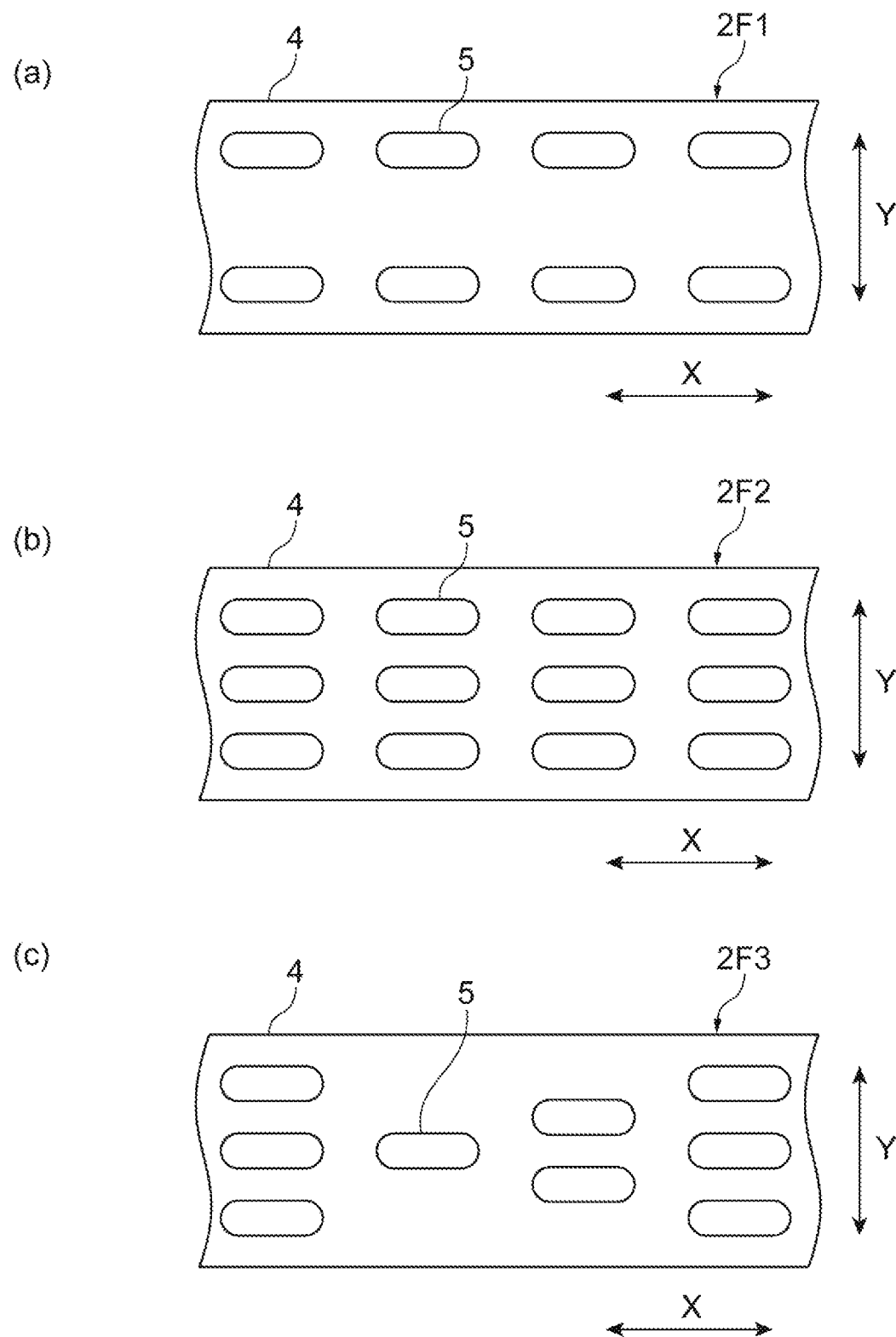
FIGS. 17(a), 17(b), and 17(c) are plan views illustrating anisotropic conductive films of modified examples.

Further, the plurality of adhesive film pieces 5 may be arranged as one row in the width direction of the release film 4 or may be arranged as a plurality of rows in the width direction of the release film 4. As illustrated in FIG. 2, in the embodiment, the plurality of adhesive film pieces 5 are arranged as one row in the width direction of the release film 4. However, the plurality of adhesive film pieces 5 may be arranged as two rows in the width direction of the release film 4 as in an anisotropic conductive film 2F1 illustrated in FIG. 17(*a*), may be arranged as three rows in the width direction of the release film 4 as in an anisotropic conductive film 2F2 illustrated in FIG. 17(*b*), or may be arranged such that the number of arrangements in the width direction of the release film 4 is different in the longitudinal direction of the release film 4 as in an anisotropic conductive film 2F3 illustrated in FIG. 17(*c*).

Further, the plurality of adhesive film pieces 5 spaced in the longitudinal direction X of the release film 4 may be arranged at a non-overlapping position or an overlapping position when viewed from the width direction Y of the release film 4. As illustrated in FIG. 2, in the embodiment, the plurality of adhesive film pieces 5 spaced in the longitudinal direction X of the release film 4 are arranged at a non-overlapping position when viewed from the width direction Y of the release film 4. However, the plurality of adhesive film pieces 5 spaced in the longitudinal direction X of the release film 4 may be arranged at an overlapping position when viewed from the width direction Y of the release film 4 as in the anisotropic conductive film 2B3 illustrated in FIG. 13(c) and the anisotropic conductive film 2C3 illustrated in FIG. 14(c).

Figure 4:
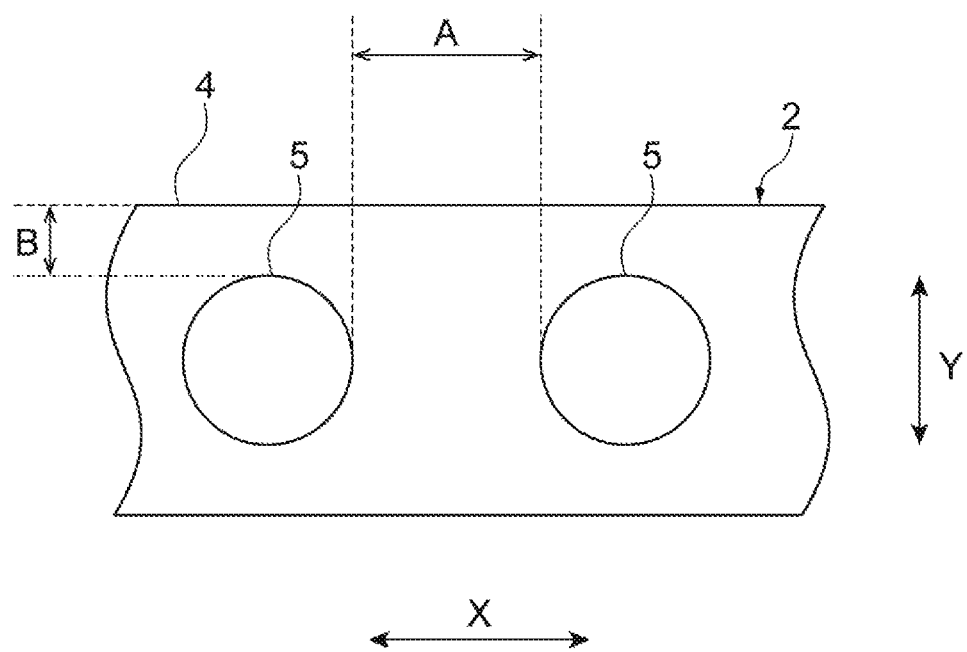
FIG. 4 is a plan view illustrating a position of an adhesive film piece with respect to a release film.

As illustrated in FIG. 4, a gap A of the plurality of adhesive film pieces 5 in the longitudinal direction X of the release film 4 can be set to 0.1 mm or more and 10 mm or less, is preferably 0.1 mm or more and 0.8 mm or less, and is more preferably 0.2 mm or more and 0.5 mm or less. Further, a gap B between an end edge of the release film 4 and the adhesive film piece 5 closest to the end edge in the width direction Y of the release film 4 can be set to 0.1 mm or more and 10 mm or less, is preferably 0.1 mm or more and 0.8 mm or less, and is more preferably 0.2 mm or more and 0.5 mm or less.

[Connection Structure]

Figure 5:
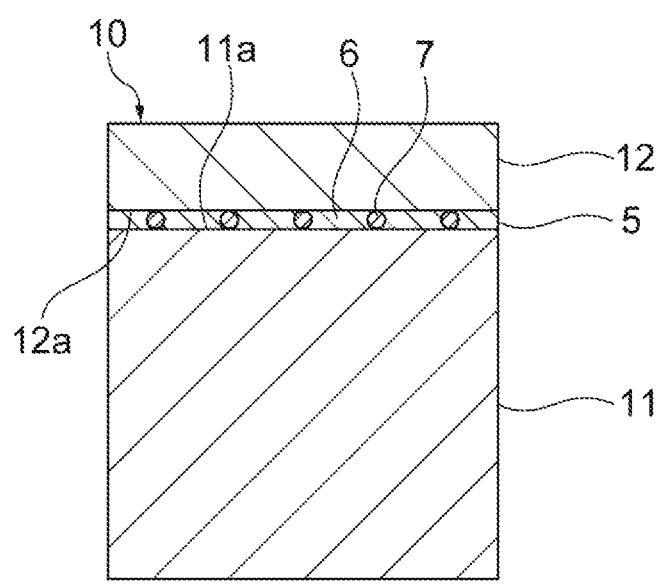
FIG. 5 is a cross-sectional view illustrating a connection structure according to the embodiment.

As illustrated in FIG. 5, the connection structure 10 includes a first circuit member 11 that includes a first adhesive surface 11a, a second circuit member 12 that includes a second adhesive surface 12a, and the adhesive film piece 5 which connects the first adhesive surface 11a and the second adhesive surface 12a to each other.

The first circuit member 11 is, for example, a chip component such as an IC chip, an LSI chip, a resistor chip, or a capacitor chip. A surface facing the second circuit member 12 in the first circuit member 11 becomes the first adhesive surface 11a. A first electrode (not illustrated) which is used to be electrically connected to the second circuit member 12 is disposed on the first adhesive surface 11a.

The second circuit member 12 is, for example, a substrate having light transmittance such as a glass substrate, a polyimide substrate, a polyethylene terephthalate substrate, a polycarbonate substrate, a cycloolefin polymer (COP) substrate, a polyethylene naphthalate substrate, a glass reinforced epoxy substrate, a paper phenol substrate, a ceramic substrate, and a laminate plate. In the second circuit member 12, a surface facing the first adhesive surface 11a of the first circuit member 11 becomes the second adhesive surface 12a. A second electrode (not illustrated) which is electrically connected to the first circuit member 11 is disposed on the second adhesive surface 12a.

Additionally, there is no clear distinction between the first circuit member 11 and the second circuit member 12 and any member may be applied to each circuit member. As the first circuit member 11, for example, a substrate having light transmittance such as a glass substrate, a polyimide substrate, a polyethylene terephthalate substrate, a polycarbonate substrate, a cycloolefin polymer (COP) substrate, a polyethylene naphthalate substrate, a glass reinforced epoxy substrate, a paper phenol substrate, a ceramic substrate, and a laminate plate may be used. Further, as the second circuit member 12, for example, a chip component such as an IC chip, an LSI chip, a resistor chip, or a capacitor chip may be used.

The adhesive film piece 5 is the adhesive film piece 5 which is released from the anisotropic conductive film 2. In the adhesive film piece 5, the first adhesive surface 11a is connected to the second adhesive surface 12a by the adhesive 6 and the first electrode of the first adhesive surface 11a is electrically connected to the second electrode of the second adhesive surface 12a by the conductive particles 7 dispersed in the adhesive 6.

[Connection Structure Manufacturing Method]

Figure 6:
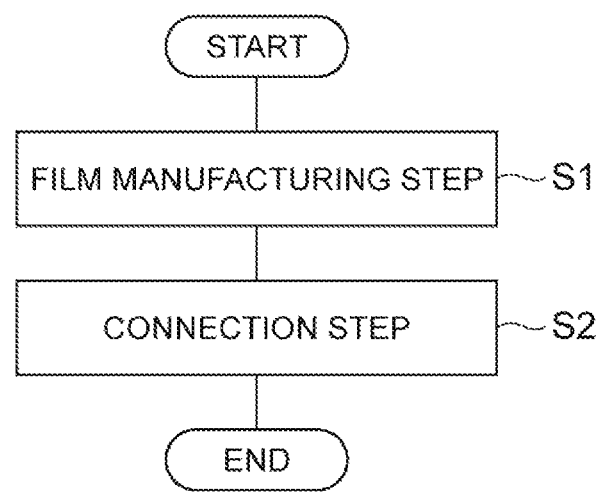
FIG. 6 is a flowchart illustrating a connection structure manufacturing method according to the embodiment.

As illustrated in FIG. 6, the connection structure manufacturing method includes a film manufacturing step (S1) and a connection step (S2) performed after the film manufacturing step (S1).

In the film manufacturing step (S1), the anisotropic conductive film 2 in which the plurality of conductive adhesive film pieces 5 are provided on the elongated release film 4 and the plurality of adhesive film pieces 5 are arranged in the longitudinal direction of the release film 4 is manufactured. The adhesive film piece 5 is one in which the conductive particles 7 are dispersed in the adhesive 6 in order to have anisotropic conductivity. In the connection step (S2), the first adhesive surface 11a of the first circuit member 11 is connected to the second adhesive surface 12a of the second circuit member 12 through the adhesive film piece 5 of the anisotropic conductive film 2.

Figure 7:
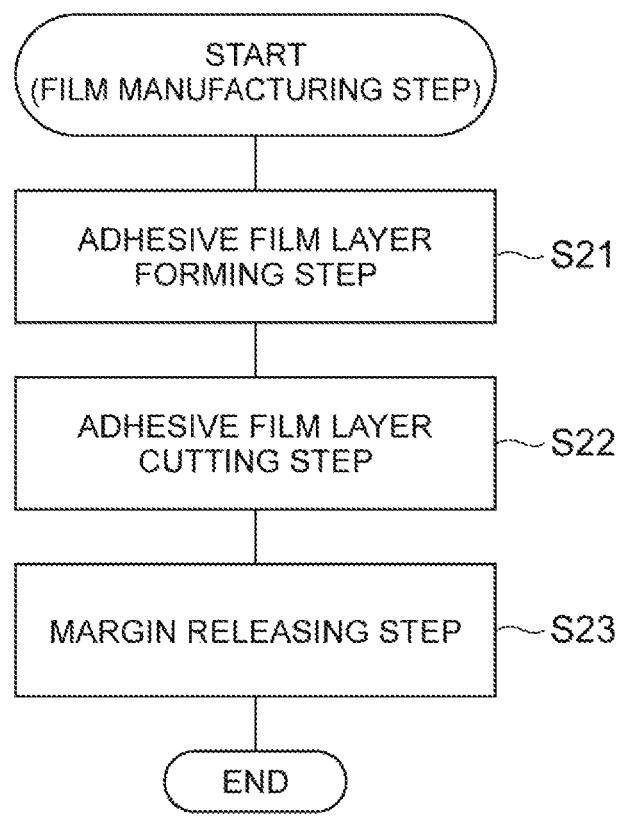
FIG. 7 is a flowchart illustrating a film manufacturing step illustrated in FIG. 6.

As illustrated in FIG. 7, the film manufacturing step (S1) includes an adhesive film layer forming step (S11), an adhesive film layer cutting step (S12) performed after the adhesive film layer forming step (S1), and a margin releasing step (S13) performed after the adhesive film layer cutting step (S12).

Figure 9:
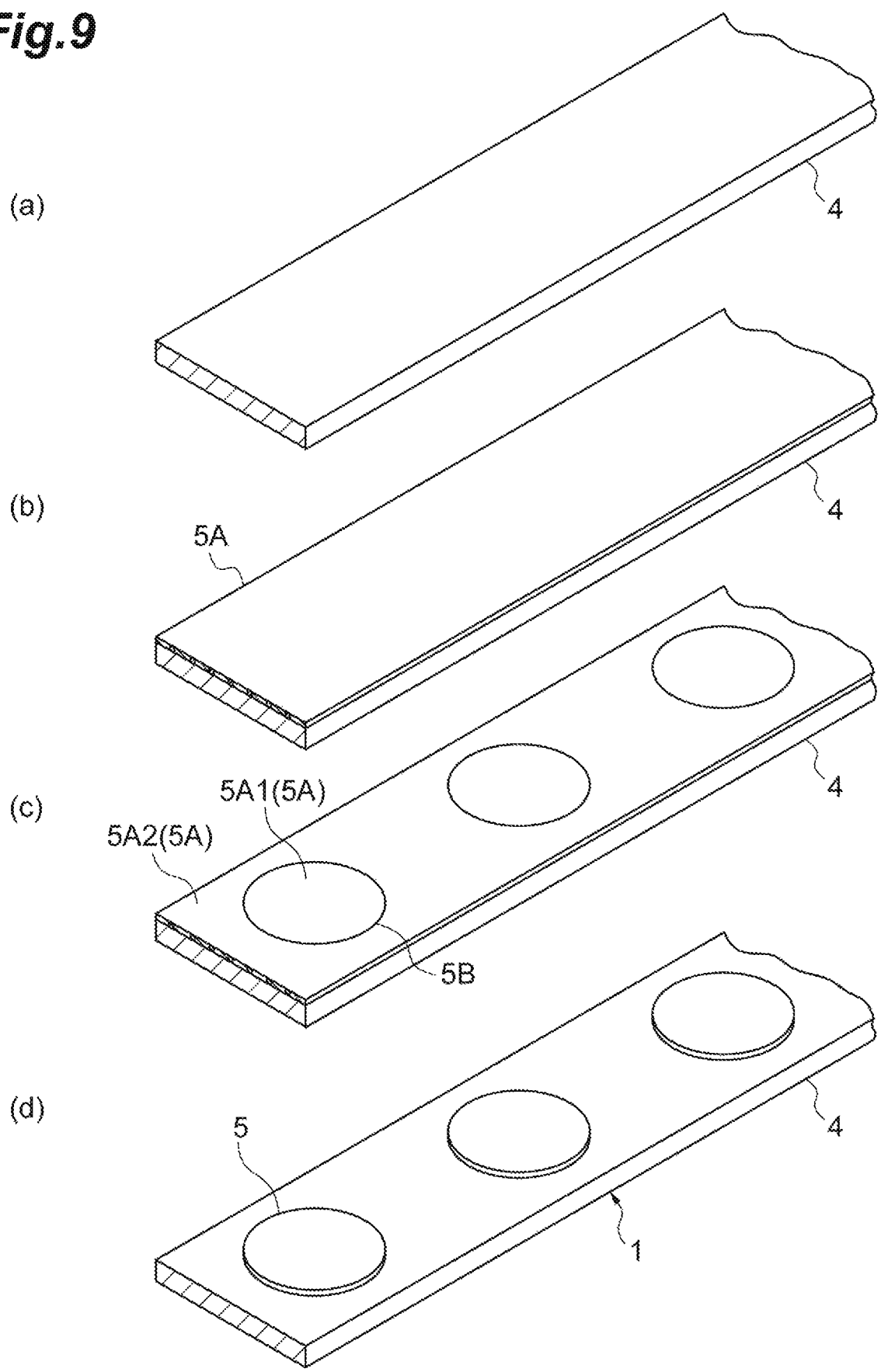
FIGS. 9(a), 9(b), 9(c), and 9(d) are perspective views illustrating the film manufacturing step illustrated in FIG. 6.

In the adhesive film layer forming step (S11), as illustrated in FIGS. 8(a) and 9(a), the release film 4 is first prepared. Then, as illustrated in FIGS. 8(b) and 9(b), a conductive adhesive film layer 5A is formed on an entire surface of the release film 4. The adhesive film layer 5A is one in which the conductive particles 7 are dispersed in the adhesive 6. The adhesive 6 and the conductive particles 7 constituting the adhesive film layer 5A are the same as the adhesive 6 and the conductive particles 7 constituting the adhesive film piece 5.

In the adhesive film layer cutting step (S12), as illustrated in FIGS. 8(c) and 9(c), the adhesive film layer 5A formed on the release film 4 is cut along an outline 5B forming the outer shape of the adhesive film piece 5. Accordingly, the adhesive film layer 5A is divided into an inner portion 5A1 which is located at the inside of the outline 5B and a plurality of margin portions 5A2 which are located at the outside of the outline 5B. The inner portion 5A1 is a portion which becomes the adhesive film piece 5. The margin portion 5A2 is a portion which becomes a portion other than the adhesive film piece 5. For example, the adhesive film layer 5A is cut in such a manner that the adhesive film layer 5A is pressed against a cutter having a cutting blade formed on the outer peripheral surface thereof. Accordingly, even when the adhesive film piece 5 has a complex shape, a fine shape, or the like, the adhesive film layer 5A can be easily cut along the outline 5B.

In the margin releasing step (S13), as illustrated in FIGS. 8(d) and 9(d), the margin portion 5A2 corresponding to a portion other than the adhesive film piece 5 in the adhesive film layer 5A is released from the release film 4 along the cut outline 5B. For example, the margin portion 5A2 is released in such a manner that an adhesive tape is attached to the margin portion 5A2 and the adhesive tape is pulled out so that the margin portion 5A2 is released from the release film 4. Then, the inner portion 5A1 which remains on the release film 4 becomes the adhesive film piece 5. Accordingly, the anisotropic conductive film 2 in which the plurality of adhesive film pieces 5 are provided on the release film 4 is manufactured.

The anisotropic conductive film 2 which is manufactured in this way is accommodated and carried as the wound body 1 in which the anisotropic conductive film is wound on the core 3 and is taken over to the connection step (S2). Additionally, the anisotropic conductive film 2 may be taken over to the connection step (S2) while not being wound as the wound body 1.

Figure 10:
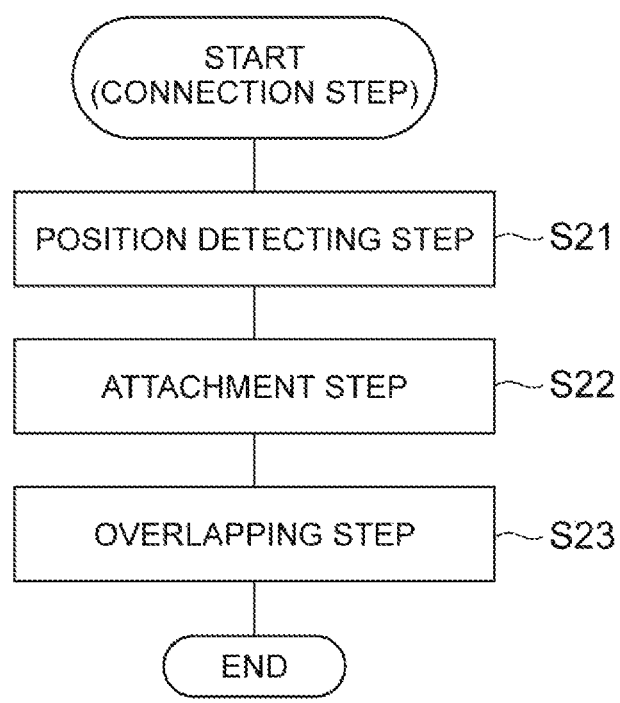
FIG. 10 is a flowchart illustrating a connection step illustrated in FIG. 6.

As illustrated in FIG. 10, the connection step (S2) includes a position detecting step (S21), an attachment step (S22), and an overlapping step (S23).

Figure 11:
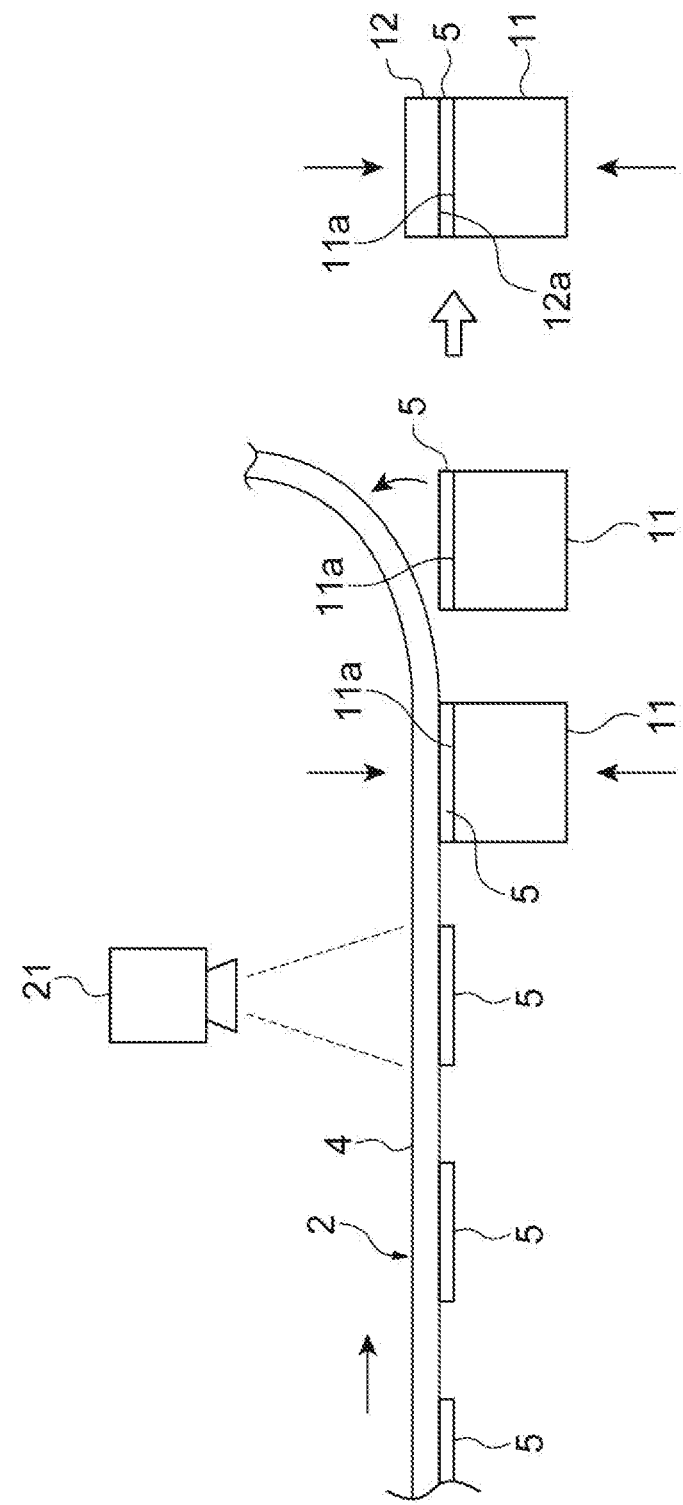
FIG. 11 is a schematic process diagram illustrating the connection step illustrated in FIG. 6.

In the position detecting step (S21), the anisotropic conductive film 2 is first unwound from the wound body 1. Then, as illustrated in FIG. 11, the position of the adhesive film piece 5 of the anisotropic conductive film is detected by the imaging device 21. At this time, the imaging device 21 may be disposed at the side of the adhesive film piece 5 with respect to the release film 4 or may be disposed at the opposite side of the adhesive film piece 5 with respect to the release film 4. As illustrated in FIG. 11, in the embodiment, the imaging device 21 is disposed at the opposite side of the adhesive film piece 5 with respect to the release film 4. In this case, the imaging device 21 can detect the position of the adhesive film piece 5 of the anisotropic conductive film 2 from the release film 4 by using the release film 4 having light transmittance.

In the attachment step (S22), the adhesive film piece 5 is attached to the first adhesive surface 11a on the basis of the position detected by the position detecting step (S21). Subsequently, the release film 4 is released from the adhesive film piece 5 attached to the first adhesive surface 11a.

In the overlapping step (S23), the first adhesive surface 11a and the second adhesive surface 12a are overlapped with the adhesive film piece 5 interposed therebetween. Accordingly, the first adhesive surface 11a and the second adhesive surface 12a are temporarily connected by the adhesive 6 of the adhesive film piece 5. Then, the first circuit member 11 and the second circuit member 12 are pressed so that the first circuit member 11 is electrically connected to the second circuit member 12 by the conductive particles 7 of the adhesive film piece 5 and the adhesive 6 of the adhesive film piece 5 is heated or irradiated with light to cure the adhesive 6. Accordingly, it is possible to obtain the connection structure 10 in which the first adhesive surface 11a and the second adhesive surface 12a are connected to each other by the adhesive film piece 5.

In this way, in the anisotropic conductive film 2 according to the embodiment, the plurality of adhesive film pieces 5 are arranged on the elongated release film 4 in the longitudinal direction X of the release film 4. For this reason, the adhesive film piece 5 can be set to an arbitrary shape. Accordingly, it is possible to attach the adhesive film piece 5 to adhesive surfaces having various shapes and to efficiently use the adhesive film piece 5.

Further, in the anisotropic conductive film 2, when the plurality of adhesive film pieces 5 are spaced in the longitudinal direction X of the release film 4, it is possible to attach the adhesive film piece 5 to the adhesive surface without affecting the near adhesive film piece 5. Accordingly, it is possible to easily attach the adhesive film piece 5 to the adhesive surface. Further, it is possible to further improve a degree of freedom in the shape of the adhesive film piece 5.

Further, in the anisotropic conductive film 2, when the plurality of adhesive film pieces 5 have the same shape, it is possible to efficiently attach the adhesive film piece 5 to a plurality of adhesive surfaces having the same shape.

Further, in the anisotropic conductive film 2, when the plurality of adhesive film pieces 5 are disposed at the center portion of the width direction of the release film 4, it is possible to easily position the anisotropic conductive film 2 with respect to the adhesive surface at the time of attaching the adhesive film piece 5 to the adhesive surface.

Further, in the anisotropic conductive film 2, when the plurality of adhesive film pieces 5 are disposed at the end portion of the width direction of the release film 4, it is possible to easily attach the adhesive film piece 5 to the adhesive surface even when there is no enough space at one side of the adhesive surface.

Further, in the anisotropic conductive film 2, when the plurality of adhesive film pieces 5 are arranged in the width direction Y of the release film 4, it is possible to increase the density of the adhesive film piece 5 with respect to the release film 4. Accordingly, it is possible to provide more adhesive film pieces 5 on the release film 4.

Further, in the anisotropic conductive film 2, when a gap of the plurality of adhesive film pieces 5 in the longitudinal direction X of the release film 4 is 0.1 mm or more, it is possible to easily attach the adhesive film piece 5 to the adhesive surface without affecting the near adhesive film piece 5. Meanwhile, when the gap is 10 mm or less, it is possible to increase the density of the adhesive film piece 5 with respect to the release film 4 and to provide more adhesive film pieces 5 on the release film 4.

Further, in the anisotropic conductive film 2, when a gap between the end edge of the release film 4 and the adhesive film piece 5 closest to the end edge in the width direction of the release film 4 is 0.1 mm or more, it is possible to prevent the adhesive film piece 5 from being released from the release film 4 even when the end portion of the release film 4 interferes with the other members. Meanwhile, when the gap is 10 mm or less, it is possible to efficiently provide the adhesive film piece 5 on the release film 4.

Further, in the anisotropic conductive film 2, when the release film 4 has light transmittance, it is possible to detect the position of the adhesive film piece 5 of the anisotropic conductive film 2 by the imaging device 21 even when the imaging device 21 is disposed at the opposite side of the adhesive film piece 5 with respect to the release film 4.

Further, in the anisotropic conductive film 2, when the transmittance of the release film 4 is 15% or more, it is possible to easily detect the position of the adhesive film piece 5 from the release film 4. Meanwhile, when the transmittance of the release film 4 is 100% or less, it is possible to easily manufacture the release film 4.

Further, in the anisotropic conductive film 2, when the haze value of the release film 4 is 3% or more, it is possible to easily detect the position of the adhesive film piece 5 from the release film 4. Meanwhile, when the haze value of the release film 4 is 100% or less, it is possible to easily manufacture the release film 4.

In the wound body 1 according to the embodiment, since the anisotropic conductive film 2 is wound on the core 3, it is possible to attach the adhesive film piece 5 to adhesive surfaces having various shapes and to efficiently use the adhesive film piece 5.

In the connection structure 10 according to the embodiment, the first adhesive surface 11a and the second adhesive surface 12a are connected to each other by the adhesive film piece 5. For this reason, it is possible to obtain the connection structure 10 in which the adhesive film piece 5 is appropriately attached to the first adhesive surface 11a and the second adhesive surface 12a regardless of the shapes of the first adhesive surface 11a and the second adhesive surface 12a.

In the connection structure manufacturing method according to the embodiment, the anisotropic conductive film 2 in which the plurality of adhesive film pieces 5 are provided on the release film 4 is manufactured and the first adhesive surface 11a and the second adhesive surface 12a are connected with the adhesive film piece 5 of the anisotropic conductive film 2 interposed therebetween. Then, since the adhesive film piece 5 can be set to an arbitrary shape, it is possible to manufacture the connection structure 10 in which the adhesive film piece 5 is appropriately attached to the first adhesive surface 11a and the second adhesive surface 12a regardless of the shapes of the first adhesive surface 11a and the second adhesive surface 12a. Further, it is possible to efficiently use the adhesive film piece 5.

Further, in the connection structure manufacturing method, the adhesive film layer 5A is formed on an entire surface of the release film 4, the adhesive film layer 5A is cut along the outline 5B, and the margin portion 5A2 is released from the release film 4 along the cut outline 5B. Accordingly, it is possible to easily provide the plurality of adhesive film pieces 5 on the release film 4.

Further, in the connection structure manufacturing method, the position of the adhesive film piece 5 of the anisotropic conductive film 2 is detected by the imaging device 21 and the adhesive film piece 5 is attached to the first adhesive surface 11a on the basis of the detected position. For this reason, it is possible to improve the position accuracy of the adhesive film piece 5 with respect to the adhesive surface. Then, since the first adhesive surface 11a and the second adhesive surface 12a are overlapped with the adhesive film piece 5 interposed therebetween, it is possible to easily accommodate the adhesive film piece 5 in the first adhesive surface 11a and the second adhesive surface 12a.

Further, in the connection structure manufacturing method, since the release film 4 is released from the adhesive film piece 5 after the adhesive film piece 5 is attached to the first adhesive surface 11a, it is possible to easily attach the adhesive film piece 5 to the first adhesive surface 11a.

The invention is not limited to the above-described embodiment and can be appropriately modified without departing from the spirit of the invention. Hereinafter, modified examples of the above-described embodiment will be described.

First Modified Example

Figure 19:
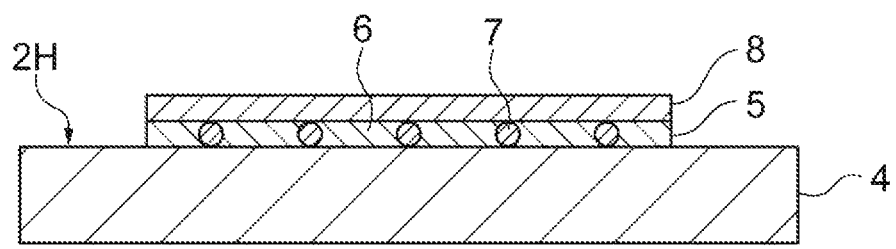
FIG. 19 is a cross-sectional view illustrating an anisotropic conductive film of a first modified example.

As illustrated in FIG. 19, an anisotropic conductive film 2H of a first modified example further includes a second release film piece 8 which covers the adhesive film piece 5. That is, the anisotropic conductive film 2H includes the elongated release film 4, the plurality of adhesive film pieces 5 which are provided on the release film 4 and in which the conductive particles 7 are dispersed in the adhesive 6, and the second release film piece 8 which is provided on each adhesive film piece 5. The second release film piece 8 is a film which protects the adhesive film piece 5 by covering the surface of the adhesive film piece 5. For this reason, in the first modified example, the wound body 1 is formed such that the anisotropic conductive film 2H is wound on the core 3.

In the first modified example, the film manufacturing step (S1) and the connection step (S2) are set as below.

In the adhesive film layer forming step (S11) of the film manufacturing step (S1), the release film 4 is first prepared as illustrated in FIG. 20(a). Next, as illustrated in FIG. 20(b), the adhesive film layer 5A is formed on an entire surface of the release film 4. Next, as illustrated in FIG. 20(c), a second release film 8A is covered (attached) on an entire surface of the adhesive film layer 5A. The material of the second release film 8A is the same as that of the second release film piece 8.

In the adhesive film layer cutting step (S12) of the film manufacturing step (S1), as illustrated in FIG. 20(d), the adhesive film layer 5A and the second release film 8A formed on the release film 4 are cut along the outline 5B. Accordingly, the adhesive film layer 5A is divided into the inner portion 5A1 which is located at the inside of the outline 5B and the plurality of margin portions 5A2 which are located at the outside of the outline 5B. Similarly, the second release film 8A is divided into an inner portion 8A1 which is located at the inside of the outline 5B and a plurality of margin portions 8A2 which are located at the outside of the outline 5B.

In the margin releasing step (S13) of the film manufacturing step (S1), as illustrated in FIG. 20(e), the margin portion 5A2 and the margin portion 8A2 are released from the release film 4 along the cut outline 5B. Then, the inner portion 5A1 and the inner portion 8A1 remain on the release film 4. The inner portion 5A1 and the inner portion 8A1 which remain on the release film 4 become the adhesive film piece 5 and the second release film piece 8. Accordingly, the anisotropic conductive film 2H in which the plurality of adhesive film pieces 5 covered with the second release film piece 8 are provided on the release film 4 is manufactured.

The anisotropic conductive film 2H is accommodated and carried as the wound body 1 in which the anisotropic conductive film is wound on the core 3 and is taken over to the connection step (S2). Additionally, the anisotropic conductive film 2H may be taken over to the connection step (S2) while not being wound as the wound body 1.

In the connection step (S2), a second release film piece releasing step is performed before the attachment step (S22). In the releasing step, the second release film piece 8 is first released from the adhesive film piece 5 in the anisotropic conductive film 2H drawn out from the wound body 1. For example, it is possible to release the second release film piece 8 in such a manner that an adhesive tape is attached to the second release film piece 8 and the adhesive tape is pulled out so that the second release film piece 8 is released from the adhesive film piece 5. Additionally, the releasing step may be performed at any stage of the connection step (S2) as long as the step is before the attachment step (S22). The subsequent steps are the same as those of the above-described embodiment.

In this way, in the anisotropic conductive film 2H of the first modified example, since the surface of the adhesive film piece 5 is covered with the second release film piece 8, it is possible to protect the adhesive film piece 5. For this reason, it is possible to prevent the adhesive film piece 5 from being transferred to the release film 4 adjacent to the inner peripheral side or the outer peripheral side in the wound body 1 in which the anisotropic conductive film 2H is wound on the core 3.

Further, in the first modified example, the adhesive film layer 5A is formed on an entire surface of the release film 4, an entire surface of the adhesive film layer 5A is covered with the second release film 8A, the adhesive film layer 5A is cut along the outline 5B, and the margin portion 5A2 is released from the release film 4 along the cut outline 5B. Accordingly, it is possible to easily provide the plurality of adhesive film pieces 5 on the release film 4 and to cover the adhesive film piece 5 with the second release film piece 8.

Further, since the second release film piece 8 is released from the adhesive film piece 5 before the attachment step, it is possible to reliably attach the adhesive film piece 5 to the first adhesive surface 11a.

Second Modified Example

Figure 21:
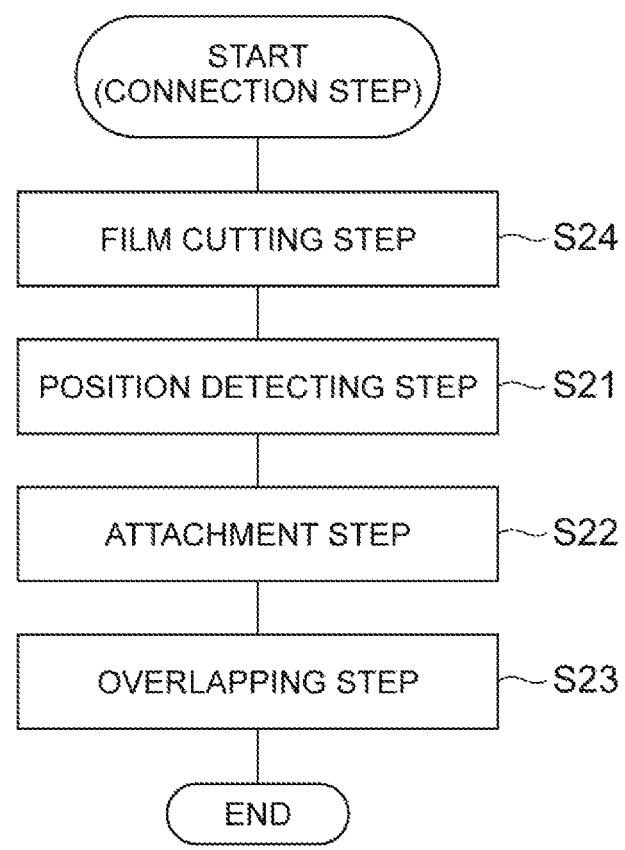
FIG. 21 is a flowchart illustrating a connection step of a connection structure manufacturing method of a second modified example.

As illustrated in FIG. 21, in a connection structure manufacturing method of a second modified example, the connection step (S2) further includes a film cutting step (S24) which is performed before the position detecting step (S21).

Figure 22:
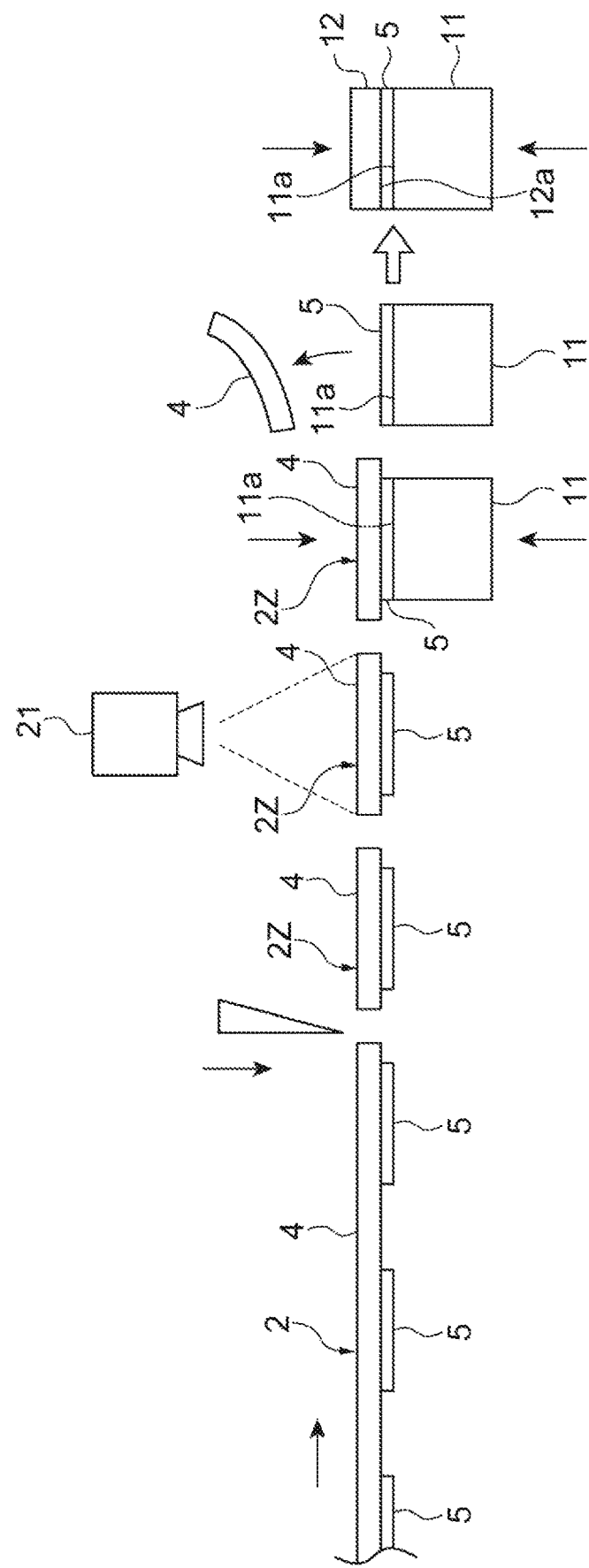
FIG. 22 is a schematic process diagram illustrating the connection step illustrated in FIG. 21.
Figure 23:
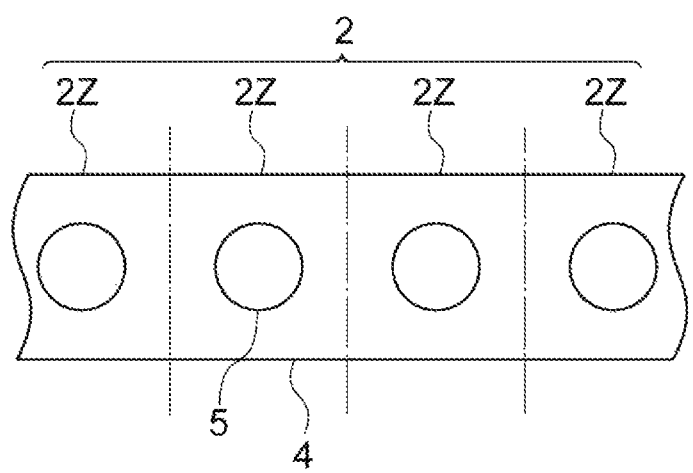
FIG. 23 is a plan view illustrating a film cutting step illustrated in FIG. 21.

In the film cutting step (S24), as illustrated in FIGS. 22 and 23, the anisotropic conductive film 2 is first cut into the plurality of anisotropic conductive film pieces 2Z. The anisotropic conductive film piece 2Z is a film piece in which the release film 4 is provided with one or the plurality of adhesive film pieces 5. Then, in the position detecting step (S21) after the film cutting step (S24), the position of the adhesive film piece 5 in the anisotropic conductive film piece 2Z is detected by the imaging device 21. The anisotropic conductive film piece 2Z may be provided with only one adhesive film piece 5 or two or more adhesive film pieces 5. In the embodiment, the anisotropic conductive film piece 2Z is provided with only one adhesive film piece 5.

In the connection structure manufacturing method, since the anisotropic conductive film 2 is cut into the plurality of anisotropic conductive film pieces 2Z, it is possible to flexibly handle a case in which the adhesive film piece 5 is attached to a plurality of positions or the attachment direction of the adhesive film piece 5 needs to be changed. Then, since the position of the adhesive film piece 5 of the anisotropic conductive film piece 2Z is detected by the imaging device 21, it is possible to improve the position accuracy of the adhesive film piece 5 with respect to the adhesive surface even when the anisotropic conductive film 2 is cut into the plurality of anisotropic conductive film pieces 2Z.

Third Modified Example

In the above-described embodiment, a case in which the conductive film according to the invention is applied to the anisotropic conductive film having anisotropic conductivity has been described, but the conductive film according to the invention is not limited to the anisotropic conductive film having anisotropic conductivity. That is, the adhesive film piece and the adhesive film layer may not be formed such that conductive particles are dispersed in the adhesive as long as conductivity is provided. As the adhesive film piece and the adhesive film layer in this case, metal oxides such as indium tin oxide (ITO), indium oxide, and tin oxide, those containing conductive fibers, and the like may be included. Examples of this conductive fiber include metal fibers such as gold, silver, and platinum and carbon fibers such as carbon nanotubes.

REFERENCE SIGNS LIST

1: wound body, 2 (2A, 2B1, 2B2, 2B3, 2C1, 2C2, 2C3, 2D, 2E, 2F1, 2F2, 2F3, 2G1, 2G2, 2G3, 2H): anisotropic conductive film (conductive film), 2Z: anisotropic conductive film piece (conductive film piece), 3: core, 3a: core material, 3b: side plate, 4: release film, 5: adhesive film piece, 5A: adhesive film layer, 5A1: inner portion, 5A2: margin portion, 5B: outline, 6: adhesive, 7: conductive particles, 8: second release film piece, 8A: second release film, 8A1: inner portion, 8A2: margin portion, 10: connection structure, 11: first circuit member, 11a: first adhesive surface, 12: second circuit member, 12a: second adhesive surface, 21: imaging device, X: longitudinal direction, Y: width direction, Z: thickness direction.

The invention claimed is:

1. A conductive film comprising:
an elongated release film; and
a plurality of conductive adhesive film pieces which are provided on and cover portions of a major surface of the release film,
wherein the plurality of conductive adhesive film pieces are arranged in a longitudinal direction of the release film,
wherein the plurality of conductive adhesive film pieces are spaced in the longitudinal direction of the release film, and adjacent ones of the plurality of adhesive film pieces are separated from one another by a gap in the longitudinal direction of the release film of 0.1 mm or more and 10 mm or less, and
wherein the conductive adhesive film pieces have substantially the same thickness.

2. The conductive film according to claim 1, wherein the plurality of adhesive film pieces are spaced in the longitudinal direction of the release film.

3. The conductive film according to claim 1, wherein the plurality of adhesive film pieces have the same shape.

4. The conductive film according to claim 1, wherein the plurality of adhesive film pieces are disposed at a center portion of the release film in a width direction.

5. The conductive film according to claim 1, wherein the plurality of adhesive film pieces are disposed at an end portion of the release film in a width direction.

6. The conductive film according to claim 1, wherein the plurality of adhesive film pieces are also arranged in the width direction of the release film.

7. The conductive film according to claim 1, wherein a gap between an end edge of the release film and the adhesive film piece closest to the end edge in the width direction of the release film is 0.1 mm or more and 10 mm or less.

8. The conductive film according to claim 1, wherein the release film has light transmittance.

9. The conductive film according to claim 8, wherein transmittance of the release film is 15% or more and 100% or less.

10. The conductive film according to claim 8, wherein a haze value of the release film is 3% or more and 100% or less.

11. The conductive film according to claim 1, further comprising:
a second release film piece which is provided on the adhesive film piece.

12. The conductive film according to claim 1, wherein the adhesive film piece is formed such that conductive particles are dispersed in an adhesive.

13. A wound body comprising:
the conductive film according to claim 1; and
a core on which the conductive film is wound.

14. A connection structure comprising:
a first circuit member that includes a first adhesive surface;
a second circuit member that includes a second adhesive surface; and
the adhesive film piece according to claim 1 which connects the first adhesive surface and the second adhesive surface.

15. A connection structure manufacturing method comprising:
a film manufacturing step of manufacturing a conductive film in which a plurality of conductive adhesive film pieces are provided on and covering portions of a major surface of an elongated release film, the plurality of adhesive film pieces are arranged in a longitudinal direction of the release film, the plurality of adhesive film pieces are spaced in the longitudinal direction of the release film, and adjacent ones of the plurality of adhesive film pieces are separated from one another by a gap in the longitudinal direction of the release film of 0.1 mm or more and 10 mm or less; and a connection step of connecting a first adhesive surface of a first circuit member and a second adhesive surface of a second circuit member with the adhesive film piece of the conductive film interposed therebetween, wherein the conductive adhesive film pieces have substantially the same thickness.

16. The connection structure manufacturing method according to claim 15, wherein the adhesive film piece is formed such that conductive particles are dispersed in an adhesive.

17. The connection structure manufacturing method according to claim 15, wherein the film manufacturing step includes an adhesive film layer forming step of forming a conductive adhesive film layer on an entire surface of the release film, an adhesive film layer cutting step of cutting the adhesive film layer along an outline forming an outer shape of the adhesive film piece, and a margin releasing step of releasing a margin portion corresponding to a portion other than the adhesive film piece in the adhesive film layer from the release film along the cut outline.

18. A conductive film comprising:

an elongated release film; and a plurality of conductive adhesive film pieces which are provided on and cover portions of a major surface of the release film, wherein each of the plurality of conductive adhesive film pieces comprises an adhesive selected from a thermosetting resin, a mixed material of thermoplastic resin and thermosetting resin, and photocurable resin, wherein the plurality of conductive adhesive film pieces are arranged in a longitudinal direction of the release film, wherein the plurality of conductive adhesive film pieces are spaced in the longitudinal direction of the release film wherein a region between the plurality of conductive adhesive film pieces is a portion where nothing is provided on the release film, and wherein the conductive adhesive film pieces have substantially the same thickness.

19. The conductive film according to claim 18, wherein the plurality of adhesive film pieces have the same shape.

20. The conductive film according to claim 18, wherein the plurality of adhesive film pieces are disposed at a center portion of the release film in a width direction.

21. The conductive film according to claim 18, wherein adjacent ones of the plurality of adhesive film pieces are separated from one another by a gap in the longitudinal direction of the release film of 0.1 mm or more and 10 mm or less.

22. The conductive film according to claim 18, wherein a gap between an end edge of the release film and the adhesive film piece closest to the end edge in the width direction of the release film is 0.1 mm or more and 10 mm or less.

23. The conductive film according to claim 18, wherein the release film has light transmittance.

24. The conductive film according to claim 23, wherein transmittance of the release film is 15% or more and 100% or less.

25. The conductive film according to claim 23, wherein a haze value of the release film is 3% or more and 100% or less.

26. The conductive film according to claim 18, wherein the adhesive film piece is formed such that conductive particles are dispersed in an adhesive.

27. A wound body comprising:

the conductive film according to claim 18; and a core on which the conductive film is wound.

28. The conductive film according to claim 1, wherein each of the plurality of conductive adhesive film pieces has a substantially flat surface.

29. The conductive film according to claim 18, wherein each of the plurality of conductive adhesive film pieces has a substantially flat surface.

30. The conductive film according to claim 1, wherein the elongated release film is tape shaped.

31. The conductive film according to claim 18, wherein the elongated release film is tape shaped.

* * * * *